(12) United States Patent
Tanizaki

(10) Patent No.: US 7,369,429 B2
(45) Date of Patent: May 6, 2008

(54) NON-VOLATILE MEMORY DEVICE HAVING TOGGLE CELL

(75) Inventor: Hiroaki Tanizaki, Itami (JP)

(73) Assignee: Renesas Technology Corp., Tokyo (JP)

( * ) Notice: Subject to any disclaimer, the term of this patent is extended or adjusted under 35 U.S.C. 154(b) by 227 days.

(21) Appl. No.: 11/400,529

(22) Filed: Apr. 10, 2006

(65) Prior Publication Data

US 2006/0233018 A1   Oct. 19, 2006

(30) Foreign Application Priority Data

Apr. 14, 2005   (JP) ............................... 2005-116572

(51) Int. Cl.
   *G11C 11/00*   (2006.01)
(52) U.S. Cl. ........................ 365/158; 365/171; 365/173
(58) Field of Classification Search ................ 365/158, 365/171, 173
   See application file for complete search history.

(56) References Cited

U.S. PATENT DOCUMENTS 6,545,906 B1   4/2003   Savtchenko et al.
6,744,663 B2   6/2004   Garni et al.
7,158,407 B2 *  1/2007   Rizzo et al. ................ 365/173

FOREIGN PATENT DOCUMENTS

JP   2001-357666   12/2001

OTHER PUBLICATIONS

Najas, J., et al. "A 4Mb 0.18 μm 1T1MTJ Toggle MRAM Memory" ISSCC2004, Session 2, pp. 22-23.

* cited by examiner

*Primary Examiner*—Richard T. Elms
*Assistant Examiner*—Nam Nguyen
(74) *Attorney, Agent, or Firm*—McDermott Will & Emery LLP

(57) ABSTRACT

A tunneling magneto-resistance element is arranged on an upper layer side of a digit line. The tunneling magneto-resistance element is electrically coupled to a source/drain region of an access transistor through a strap and a contact hole. A bit line is electrically coupled to the tunneling magneto-resistance element, and arranged on the upper layer side of the tunneling magneto-resistance element. A plurality of tunneling magneto-resistance elements share one access transistor, so that a non-volatile memory device achieving low area penalty and higher integration can be implemented.

13 Claims, 24 Drawing Sheets

NON-VOLATILE MEMORY DEVICE HAVING TOGGLE CELL

BACKGROUND OF THE INVENTION

1. Field of the Invention

The present invention relates to a non-volatile memory device, and more particularly to a random access memory including a memory cell having a magnetic tunnel junction (MTJ).

2. Description of the Background Art

Recently, an MRAM (Magnetic Random Access Memory) device has attracted attention as a new-generation non-volatile memory device. The MRAM device is a non-volatile memory device storing data in a non-volatile manner with a plurality of thin film magnetic elements formed on a semiconductor integrated circuit, and allowing random access to each thin film magnetic element. Particularly, it has been disclosed that performance of the MRAM device is remarkably enhanced by employing a thin film magnetic element using the magnetic tunnel junction (MTJ) as a memory cell in recent days.

Generally, data can be read from a memory cell used as a memory element of such a non-volatile memory device, in such a manner that a current that flows through a tunneling magneto-resistance element (TMR) constituting the memory element or a voltage at opposing ends of the TMR is measured, so as to indirectly measure a resistance value of the TMR.

Various types of memory cells have been proposed, and what is called a toggle cell has recently been disclosed. "A 4 Mb 0.18 µm 1T1MTJ Toggle MRAM Memory" ISSCC 2004 shows a structure of a basic toggle cell. As will be described later, an SAF structure is used in a free layer in the structure of the toggle cell, in which orientation of fixed magnetization is inclined at a prescribed angle with respect to a bit line and a digit line.

The toggle cell serves to magnetize a free layer, as a result of a prescribed write operation, in a direction always opposite to a magnetic direction thereof prior to the write operation. Specifically, once the prescribed write operation is performed, transition from one state to the other state, i.e., one of parallel (low resistance) and antiparallel (high resistance) to the magnetic direction of the free layer and a fixed layer, is surely made. Namely, storage data is surely rewritten to inverted data as a result of one write operation. U.S. Pat. No. 6,744,663 discloses self-reference type data reading using a toggle cell.

On the other hand, with growing tendency toward greater memory capacity along with higher speed of a CPU, it is also important to improve integration of a memory cell.

Japanese Patent Laying-Open No. 2001-357666 discloses a scheme to improve integration by reducing the number of parts in a single memory cell by stacking a plurality of tunneling magneto-resistance elements so as to share an access transistor.

Japanese Patent Laying-Open No. 2001-357666, however, shows a structure in which tunneling magneto-resistance elements (thin film magnetic elements) are stacked.

SUMMARY OF THE INVENTION

An object of the present invention is to provide a non-volatile memory device achieving improved integration, with regard to a toggle cell, by reducing the number of parts in the toggle cell by sharing an access transistor among a plurality of tunneling magneto-resistance elements (thin film magnetic elements).

A non-volatile memory device according to the present invention includes: a plurality of memory cells arranged in matrix of rows and columns; a plurality of bit lines provided corresponding to memory cell columns respectively and supplied with a first data write current in data writing; and a plurality of digit lines corresponding to a plurality of magneto-resistance elements respectively and supplied with a second data write current in data writing. Each memory cell includes a plurality of magneto-resistance elements each performing magnetically non-volatile data storage and a switch commonly controlling electrical connection between a corresponding bit line and a fixed voltage through each magneto-resistance element.

Each magneto-resistance element includes a fixed magnetic layer arranged along an easy axis at a prescribed angle to the corresponding bit line and a corresponding digit line, and a free magnetic layer having a magnetic direction reversed with respect to previous data by application of prescribed data write magnetic field, as a result of flow of the first and second data write currents having a prescribed pulse sequence in the corresponding bit line and the corresponding digit line in data writing.

Another non-volatile memory device according to the present invention includes a memory cell and a read bit line electrically coupled to the memory cell in data reading. Each memory cell includes a plurality of stacked magneto-resistance elements each performing magnetically non-volatile data storage and a switch commonly controlling electrical connection between each magneto-resistance element and the read bit line. The non-volatile memory device further includes a plurality of first write current lines corresponding to the plurality of stacked magneto-resistance elements respectively and supplied with a first data write current in data writing, and a plurality of second write current lines corresponding to the plurality of stacked magneto-resistance elements respectively and supplied with a second data write current in data writing. Each magneto-resistance element includes a fixed magnetic layer arranged along an easy axis at an angle between the corresponding first and second write current lines, and a free magnetic layer having a magnetic direction reversed with respect to previous data by application of prescribed data write magnetic field, as a result of flow of the first and second data write currents having a prescribed pulse sequence in the corresponding first and second write current lines in data writing.

Yet another non-volatile memory device according to the present invention includes: a plurality of memory cells arranged in matrix of rows and columns; a plurality of bit lines provided corresponding to memory cell columns respectively and supplied with a first data write current in data writing; and a plurality of source lines each provided corresponding to a pair of adjacent memory cell columns and shared by the same. Each memory cell includes a plurality of magneto-resistance elements each performing magnetically non-volatile data storage and a switch controlling electrical connection between a corresponding bit line and a corresponding source line through each magneto-resistance element. The non-volatile memory device further includes a plurality of digit lines corresponding to the plurality of magneto-resistance elements respectively and supplied with a second data write current in data writing.

Preferably, a corresponding bit line electrically coupled to the fixed voltage through the selected memory cell as a result of control by the switch included in the selected memory cell which is selected as a data read target among the plurality of memory cells and a corresponding source line are electrically coupled to each other in data reading. The non-volatile memory device further includes: a data line electrically coupled to the corresponding source line among a plurality of source lines in data reading; a current supply circuit coupling the data line to a prescribed voltage so as to supply the selected memory cell with a through current in data reading; a data write circuit for applying the prescribed data write magnetic field to the selected memory cell; and a data read circuit for generating read data based on storage data in the selected memory cell before and after application of the prescribed data write magnetic field performed at least once in one data read operation. The data read circuit includes a comparison portion generating the read data based on comparison of the through current that flows as a result of data reading from the selected memory cell before and after application of the prescribed data write magnetic field.

The non-volatile memory device according to the present invention includes a memory cell, which includes a plurality of magneto-resistance elements and a switch controlling electrical connection between each magneto-resistance element and a bit line. Here, the switch is provided in common to the magneto-resistance elements. As one switch is provided for a plurality of magneto-resistance elements, the number of parts in a memory cell is reduced and integration of the memory cell can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
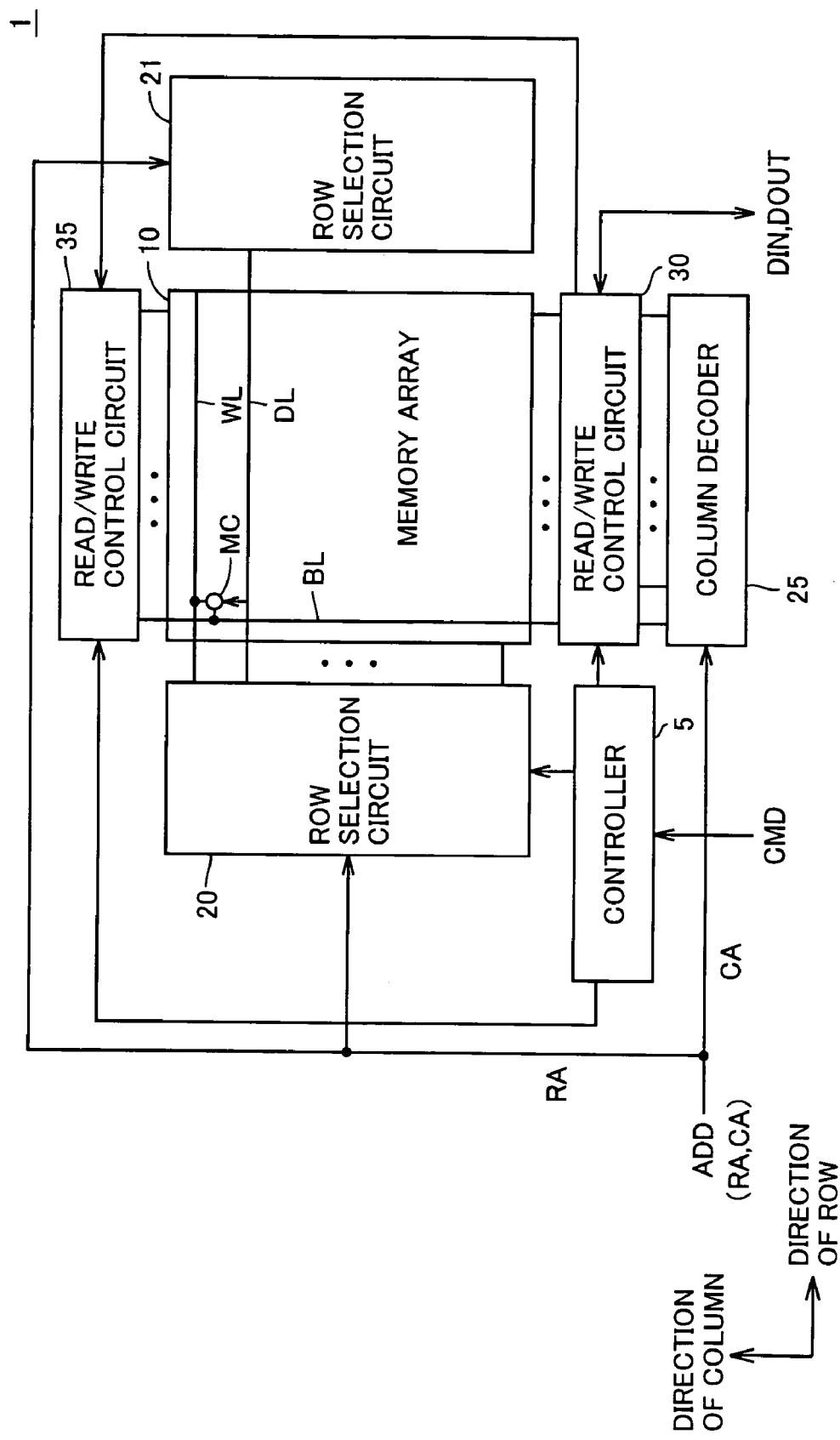
FIG. 1 is a schematic block diagram showing an overall configuration of an MRAM device representing a non-volatile memory device according to a first embodiment of the present invention.

An embodiment of the present invention will be described hereinafter in detail with reference to the drawings. The same or corresponding elements have the same reference characters allotted, and detailed description thereof will not be repeated.

First Embodiment

Referring to FIG. 1, an MRAM device 1 representing a non-volatile memory device according to a first embodiment of the present invention includes a controller 5 controlling an overall operation of MRAM device 1 in response to a control signal CMD, a memory array 10 including MTJ memory cells MC (hereinafter, also simply referred to as memory cell MC) arranged in matrix in an integrated manner, row selection circuits 20, 21, and a column decoder 25.

Row selection circuits 20, 21 perform a row selection operation in memory array 10 to be accessed, based on a row address RA included in an address signal ADD. Column decoder 25 performs a column selection operation of memory array 10 to be accessed, based on a column address CA included in address signal ADD.

MRAM device 1 further includes read/write control circuits 30, 35 provided on opposing sides of memory array 10 and performing data writing based on input data DIN or data reading for supplying the data as read data DOUT to the outside. It is noted that binary states, that is, a high voltage state and a low voltage state of a signal, a signal line and data are hereinafter also referred to as "H level" and "L level" respectively. In addition, a row and a column of a plurality of memory cells MC arranged in matrix in an integrated manner in memory array 10 are also referred to as a memory cell row and a memory cell column respectively.

Memory array 10 further includes a plurality of word lines WL and digit lines DL provided corresponding to the memory cell rows respectively as well as a plurality of bit lines BL and source lines SL provided corresponding to the memory cell columns respectively. FIG. 1 shows one memory cell MC as a representative as well as one word line WL and one digit line DL corresponding to the memory cell row of memory cell MC. In addition, FIG. 1 shows one bit line BL corresponding to the memory cell column of memory cell MC as a representative.

Figure 2:
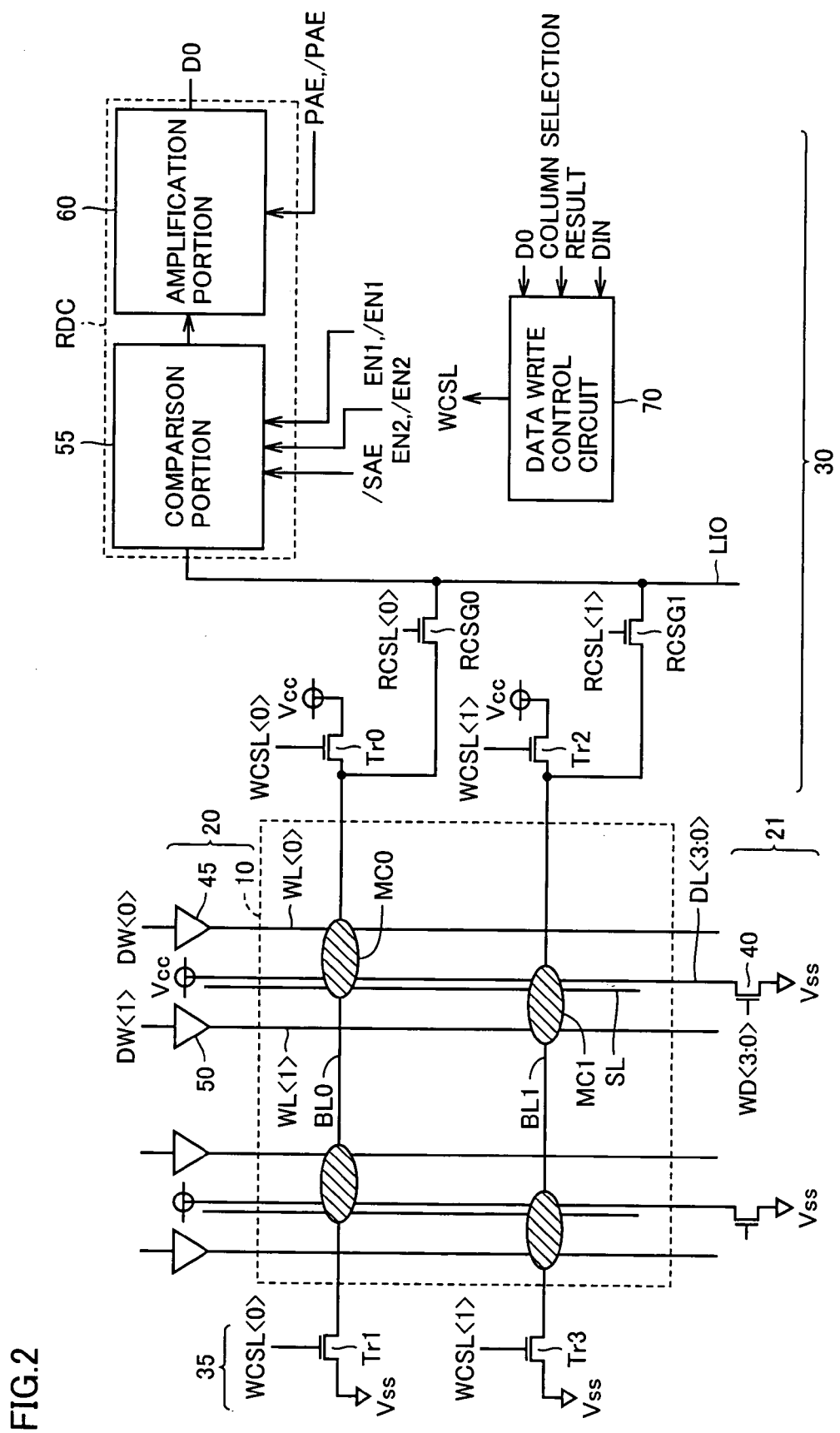
FIG. 2 is a schematic diagram showing configuration of a memory array and its peripheral circuit according to the first embodiment of the present invention.

Referring to FIG. 2, memory array 10 according to the first embodiment of the present invention includes memory cell MC arranged in matrix in an integrated manner, and a plurality of bit lines BL provided corresponding to the memory cell columns respectively. In addition, a plurality of word lines WL, a plurality of digit lines DL and a plurality of source lines SL corresponding to the memory cell rows respectively are provided. In the present embodiment, bit lines BL0, BL1 provided corresponding to the memory cell columns respectively, word lines WL<0>, WL<1> provided corresponding to the memory cell rows respectively and source line SL are shown as representatives. In the present embodiment, a memory cell MC0 located at an intersection of bit line BL0 and word line WL<0> and a memory cell MC1 located at an intersection of bit line BL1 and word line WL<1> will be described as representatives. A layout of memory cells MC and MC1 will be described later.

Row selection circuit 20 includes row drivers 45, 50 arranged for each memory cell row. Row drivers 45, 50 drive word lines WL<0>, WL<1> in response to decode signals DW<0>, DW<1> indicating a result of row selection, respectively. Row selection circuit 21 includes a transistor 40 for pulling down digit line DL<3:0> to a fixed voltage Vss. Transistor 40 turns on in response to input of a decode signal WD<3:0> indicating a result of row selection. It is noted that the denotation <z:0> means <0> to <z>. Decode signals DW and WD are signals output from a not-shown decoder included in row selection circuits 20, 21, that indicate a result of row selection based on row address RA.

Read/write control circuit 30 includes a data write control circuit 70. Data write control circuit 70 operates in response to an instruction of operation from controller 5.

In operation, data write control circuit 70 sets a write control signal WCSL for each memory cell column, in accordance with input data DIN and a result of column selection from column decoder 25. In addition, data write control circuit 70 sets write control signal WCSL in one data read operation period, upon receiving read data DO from a data read circuit RDC which will be described later. In the present embodiment, write control signals WCSL<0>, WCSL<1> corresponding to bit lines BL0, BL1 respectively are shown as examples.

Read/write control circuit 30 includes a driver transistor for pulling up bit line BL provided for each memory cell column to a power supply voltage Vcc. The present embodiment shows driver transistors Tr0, Tr2 provided corresponding to bit lines BL0, BL1 respectively, which receive inputs of write control signals WCSL<0>, WCSL<1> respectively. Read/write control circuit 35 includes a driver transistor provided for each memory cell column for pulling down the other end of bit line BL to fixed voltage Vss. The present embodiment shows driver transistors Tr1, Tr3 provided corresponding to bit lines BL0, BL1 respectively, which receive inputs of write control signals WCSL<0>, WCSL<1> respectively. For example, when write control signal WCSL<0> is set to "H" level, driver transistors Tr0, Tr1 turn on to form a current path, whereby a data write current flows through bit line BL0. When write control signal WCSL<1> is set to "H" level, driver transistors Tr2, Tr3 turn on to form a current path, whereby a data write current flows through bit line BL1.

Read/write control circuit 30 further includes a data line LIO supplied with a through current in accordance with an electric resistance of the selected memory cell and a read selection gate RCSG provided corresponding to the memory cell column and provided between data line LIO and each bit line BL. The present embodiment shows read selection gates RCSG0, RCSG1 provided corresponding to bit lines BL0, BL1 respectively, which receive inputs of read selection signals RCSL<0>, RCSL<1> respectively. When the corresponding memory cell column is selected, read selection gate RCSG turns on, and bit line BL and data line LIO are electrically coupled to each other. Similar configuration is provided corresponding to each memory cell column. Namely, data line LIO is shared by bit lines BL. According to such a configuration, the selected memory cell is electrically coupled to data line LIO through bit line BL in the selected column and corresponding read selection gate RCSG. Read selection signal RCSL is a decode signal output from column decoder 25 as indication of a result of column selection based on column address CA.

Read/write control circuit 30 further includes data read circuit RDC performing a prescribed data read operation and outputting read data DO, upon receiving inputs of a control signal /SAE and control signals EN1, /EN1, EN2, /EN2.

A toggle cell will now be described. Here, the toggle cell having one thin film magnetic element will be described.

A structure in a vertical direction of the toggle cell according to the embodiment of the present invention will schematically be described with reference to FIG. 3.

Figure 3:
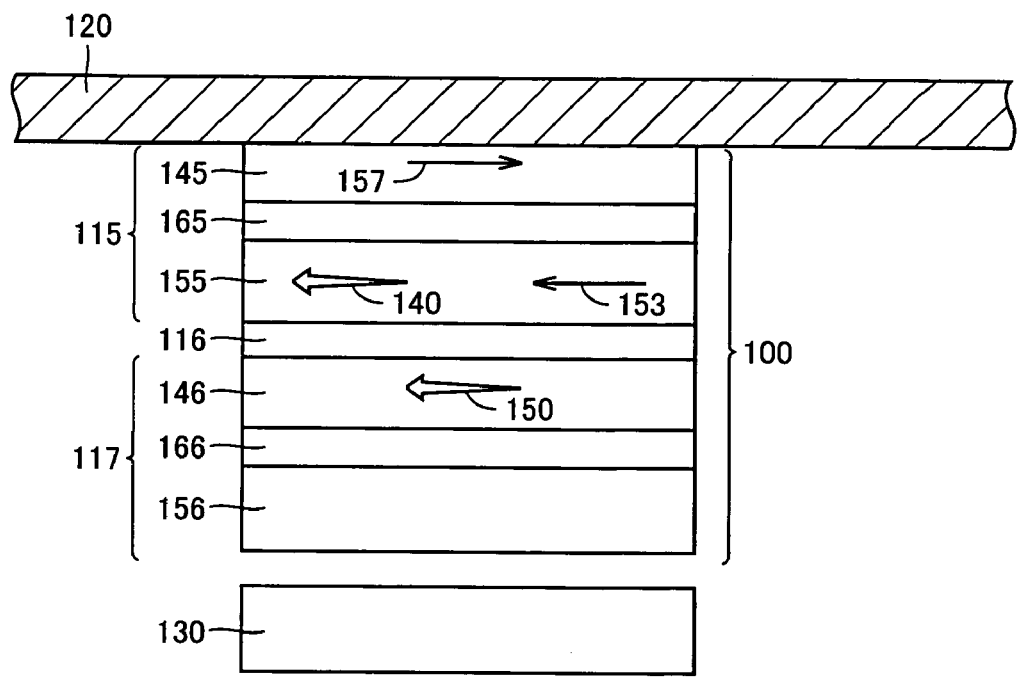
FIG. 3 schematically shows a toggle cell according to the embodiment of the present invention.

Referring to FIG. 3, the toggle cell has a thin film magnetic element 100 lying between a bit line 120 and a digit line 130. Bit line 120 and digit line 130 contain a conductive material allowing current flow. In FIG. 3, bit line 120 is positioned on thin film magnetic element 100, and digit line 130 is positioned below thin film magnetic element 100. Digit line 130 is angled at 90° with respect to bit line 120.

Thin film magnetic element 100 includes a first magnetic portion 115, a tunnel barrier 116 and a second magnetic portion 117. Tunnel barrier 116 lies between first magnetic region 115 and second magnetic region 117.

In the present embodiment, first magnetic portion 115 has a three-layered structure, which has two ferromagnetic material layers 145, 155 and an antiferromagnetic material coupling spacer layer 165 lying between two ferromagnetic material layers 145, 155. Second magnetic portion 117 has a three-layered structure, which has two ferromagnetic material layers 146, 156 and an antiferromagnetic material coupling spacer layer 166 lying between two ferromagnetic material layers 146, 156.

Antiferromagnetic material coupling spacer layers 165 and 166 contain, for example, at least one of Ru, Os, Re, Cr, Rh, and Cu, or combination thereof. Ferromagnetic material layers 145, 155, 146, and 156 contain, for example, at least one of Ni, Fe, Mn, and Co or combination thereof. First magnetic portion 115 and second magnetic portion 117 may include a synthetic antiferromagnetic layer material structure other than the three-layered structure. For example, one of such synthetic antiferromagnetic layer material structure may have a five-layered stack structure formed by a ferromagnetic material layer/an antiferromagnetic material coupling spacer layer/a ferromagnetic material layer/an antiferromagnetic material coupling spacer layer/a ferromagnetic material layer.

Ferromagnetic material layers 145 and 155 have magnetic moment vectors 157 and 153 held antiparallel to each other in a normal state as a result of coupling of antiferromagnetic material coupling spacer layer 165, respectively. First magnetic portion 115 has a resultant magnetic moment vector 140, while second magnetic portion 117 has a resultant magnetic moment vector 150.

It is assumed that resultant magnetic moment vectors 140 and 150 are oriented at a prescribed angle, preferably 45°, 135°, 225°, 315°, between bit line 120 and digit line 130 along the easy axis. This is the difference from a normal memory cell. In the memory cell, the easy axis is arranged to extend in a direction of the bit line. On the other hand, in toggle cell MC, the easy axis is arranged in a manner deviating by a prescribed angle between the bit line and the digit line.

First magnetic portion 115 serves as a free ferromagnetic material region, that is, as a free magnetic layer. In first magnetic portion 115, resultant magnetic moment vector 140 rotates in the presence of applied magnetic field. Second magnetic portion 117 serves as a ferromagnetic material region having a fixed constant magnetic direction, that is, as a fixed magnetic layer. Namely, in second magnetic portion 117, resultant magnetic moment vector 150 does not rotate freely in the presence of moderately applied magnetic field, and therefore second magnetic portion 117 is used as a reference layer.

Antiferromagnetic material coupling layer 165 is shown between two ferromagnetic material layers 145 and 155 of first magnetic portion 115, however, the ferromagnetic material layer can be an antiferromagnetic coupled through other means, such as static magnetic field or other features.

At least in producing ferromagnetic material layers 145 and 155, magnetic field is provided in order to set a preferable easy axis (induced anisotropy). The provided magnetic field creates an anisotropy axis preferable for magnetic moment vectors 153 and 157. As will be described later, the preferable axis is set such that it is angled at 45° between bit line 120 and digit line 130.

A magnetic direction of the toggle cell according to the embodiment of the present invention will be described with reference to FIG. 4.

Figure 4:
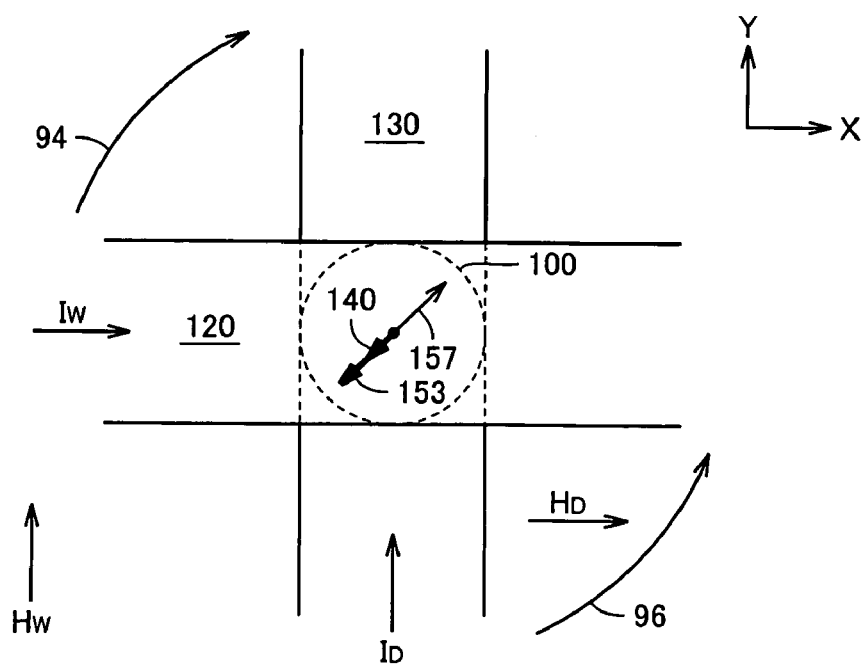
FIG. 4 illustrates a magnetic direction in the toggle cell according to the embodiment of the present invention.

Referring to FIG. 4, thin film magnetic element 100 of toggle cell MC is provided in a portion where bit line 120 and digit line 130 intersect with each other at an angle of 90°. For the sake of simplification, x-y coordinate system as shown as well as a clockwise rotation direction 94 and a counterclockwise rotation direction 96 are referred to.

The anisotropy axis preferable for magnetic moment vectors 153 and 157 is angled at 45° with respect to −x direction and −y direction and at 45° with respect to +x direction and +y direction. FIG. 4 exemplarily shows that magnetic moment vector 153 is angled at 45° with respect to −x direction and −y direction. As magnetic moment vector 157 is generally oriented antiparallel to magnetic moment vector 153, magnetic moment vector 157 is angled at 45° with respect to +x direction and +y direction.

A bit line current $I_w$ induces magnetic field $H_w$ in a circumferential direction, while a digit line current $I_p$ induces digit magnetic field $H_D$ in a circumferential direction.

As bit line 120 is provided on thin film magnetic element 100, $H_w$ is applied in +y direction with respect to bit line current $I_w$ when the element is viewed two-dimensionally. Similarly, as digit line 130 is provided under thin film magnetic element 100, $H_D$ is applied to +x direction with respect to bit line current $I_p$ when the element is viewed two-dimensionally.

A write scheme of the toggle cell according to the first embodiment of the present invention will now be described.

When a toggle writing method is used, so long as a current pulse having the same polarity is selected for both of bit line 120 and digit line 130 regardless of the direction of the current, a magnetic direction of the free magnetic layer of thin film magnetic element 100 is switched for each write operation. For example, if "1" is initially stored, switching to "0" is made after one current pulse sequence flows through the bit line and the digit line. If "0" is stored, switching again to "1" is made as a result of repetition of the current pulse sequence.

Therefore, as a result of one write sequence, a data level surely changes to an inverted data level with respect to the level stored prior to the write sequence.

A current pulse sequence in writing in the toggle cell according to the embodiment of the present invention will be described with reference to FIG. 5.

Figure 5:
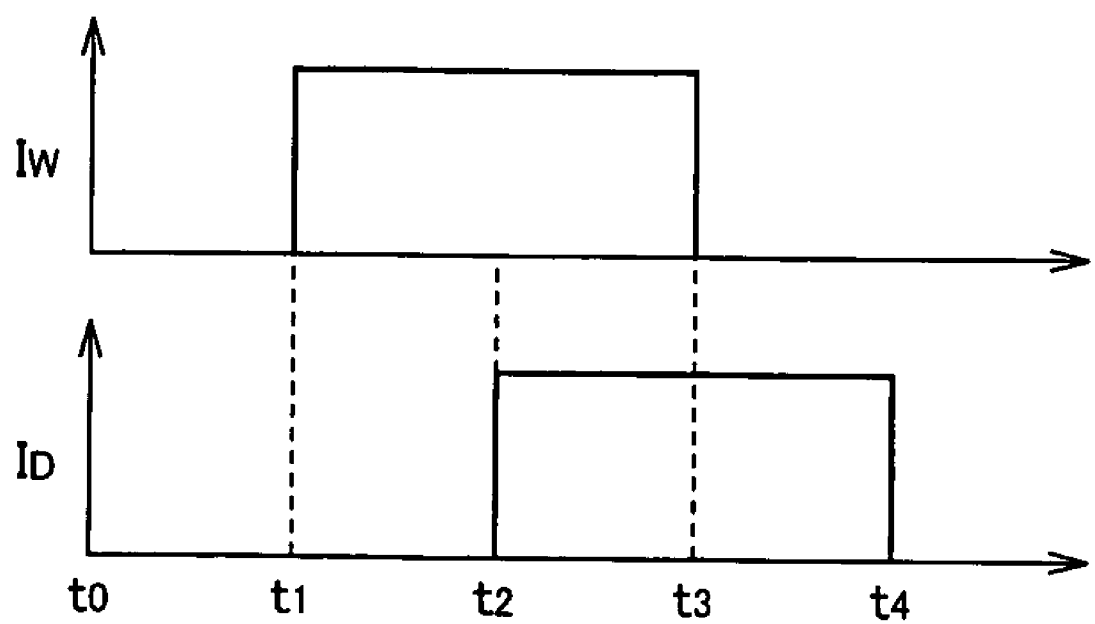
FIG. 5 illustrates a current pulse sequence in writing of the toggle cell according to the embodiment of the present invention.

FIG. 5 shows bit line current $I_w$ and digit line current $I_p$, the phase of digit line current $I_p$ being delayed by 90°.

Data writing in the toggle cell using the pulse sequence shown in FIG. 5 will be described with reference to FIG. 6.

Figure 6:
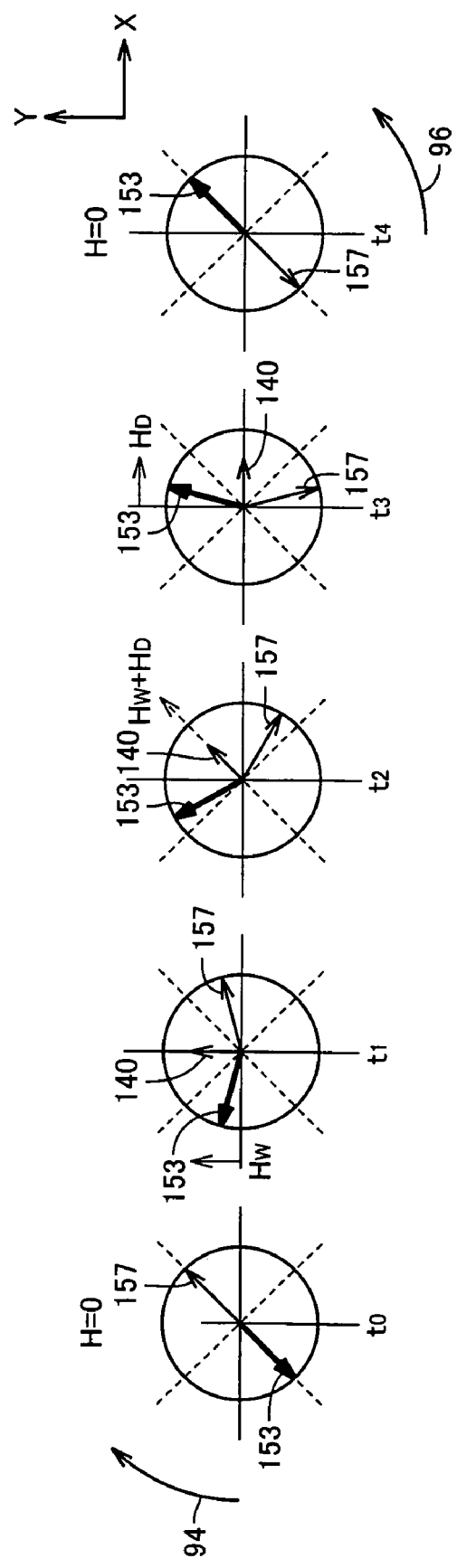
FIG. 6 illustrates data writing in the toggle cell using the pulse sequence shown in FIG. 5.

Referring now to FIG. 6, a toggle write mode for switching from "1" to "0" using the pulse sequence in FIG. 5 is shown in the present embodiment.

Here, at time $t_0$, magnetic moment vectors 153 and 157 are oriented to a preferable direction as shown in FIG. 6. This orientation is defined as "1".

At time $t_1$, bit line current $I_w$ turns on, and induces magnetic field $H_w$ in +y direction. Magnetic field $H_w$ has such an effect that the three-layered structure of first magnetic portion 115 substantially balanced and anti-aligned is "flopped" such that it is angled at approximately 90° with respect to the direction of the applied magnetic field. As a result of finite antiferromagnetic material exchange interaction between ferromagnetic material layers 145 and 155, magnetic moment vectors 153 and 157 deviate by a small angle toward the direction of the magnetic field, and resultant magnetic moment vector 140 determines a range of an angle between magnetic moment vectors 153 and 157 and is aligned with magnetic field $H_w$. Therefore, magnetic moment vector 153 rotates in clockwise direction 94. As resultant magnetic moment vector 140 represents vector addition of magnetic moment vectors 153 and 157, magnetic moment vector 157 also rotates in clockwise direction 94.

At time $t_2$, digit current $I_p$ turns on, and induces magnetic field $H_D$. Therefore, resultant magnetic moment vector 140 is oriented simultaneously to +y direction by magnetic field $H_w$ as well as to +x direction by magnetic field $H_D$, which has an effect to further rotate resultant magnetic moment vector 140 in clockwise direction 94 until resultant magnetic moment vector 140 is angled generally at 45° between +x direction and +y direction. Accordingly, magnetic moment vectors 153 and 157 also further rotate in clockwise direction 94.

At time $t_3$, bit line current $I_w$ turns off. Therefore, solely magnetic field $H_D$ orients resultant magnetic moment vector 140 in +x direction. Both of magnetic moment vectors 153 and 157 will now be generally hard-axis instability points.

At time $t_4$, digit current $I_p$ turns off, and therefore, force from magnetic field is not acting on resultant magnetic moment vector 140. Accordingly, magnetic moment vectors 153 and 157 are oriented to their closest preferable direction, whereby anisotropy energy is suppressed to minimum. Here, the direction preferable for magnetic moment vector 153 is a direction angled at 45° with respect to +y direction and +x direction. This preferable direction is a direction angled at 180° with respect to the initial direction of magnetic moment vector 153 at time to, and is defined as "0". Therefore, thin film magnetic element 100 has already been switched to "0".

Another data writing in the toggle cell using the pulse sequence shown in FIG. 5 will be described with reference to FIG. 7.

Figure 7:
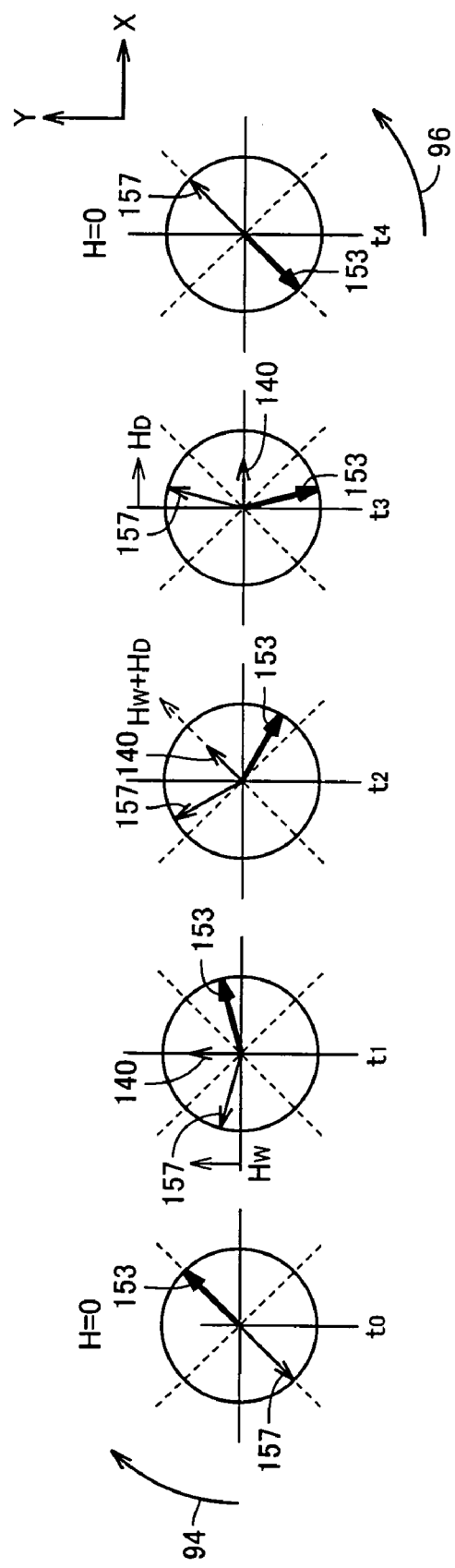
FIG. 7 illustrates another data writing in the toggle cell using the pulse sequence shown in FIG. 5.

Referring now to FIG. 7, a toggle write mode for switching from "0" to "1" using the pulse sequence in FIG. 5 is shown in the present embodiment.

FIG. 7 shows magnetic moment vectors 153 and 157 and resultant magnetic moment vector 140 at each of times $t_0$, $t_1$, $t_2$, $t_3$, and $t_4$ as described previously, and shows that the state of the thin film magnetic element can be switched from "0" to "1" using the same current and the direction of magnetic field.

Details of memory cells MC0 and MC1 according to the first embodiment of the present invention will be described with reference to FIG. 8.

Memory cell MC according to the first embodiment of the present invention is configured such that one access transistor is shared by a plurality of tunneling magneto-resistance elements TMR.

Figure 8:
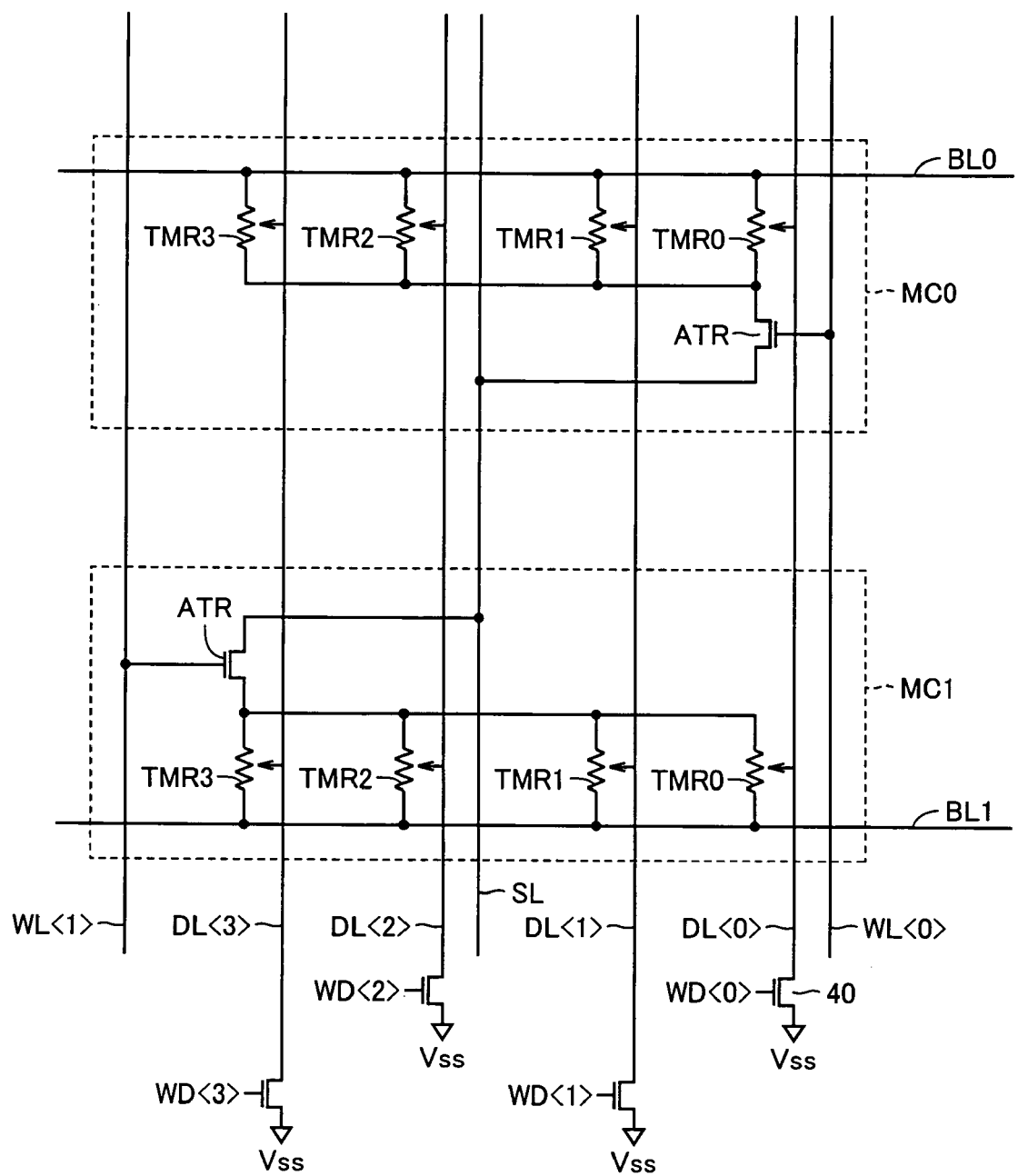
FIG. 8 is a circuit configuration diagram illustrating details of a memory cell according to the first embodiment of the present invention.

Referring to FIG. 8, memory cell MC0 according to the first embodiment of the present invention includes tunneling magneto-resistance elements TMR0 to TMR3 and access transistor ATR.

Tunneling magneto-resistance elements TMR0 to TMR3 are connected between bit line BL0 and access transistor ATR in parallel to each other. Access transistor ATR is arranged between source line SL and bit line BL0 through the plurality of tunneling magneto-resistance elements TMR, and has the gate electrically coupled to word line WL<0>.

Referring again to FIG. 8, memory cell MC1 is also configured similarly. Specifically, tunneling magneto-resistance elements TMR0 to TMR3 are connected between bit line BL1 and access transistor ATR in parallel to each other. Access transistor ATR is arranged between source line SL and bit line BL1 through the plurality of tunneling magneto-resistance elements, and has the gate electrically coupled to word line WL<1>. Here, memory cells MC0 and MC1 share source line SL. One source line SL is provided for every two memory cell rows. In memory cells MC0 and MC1, tunneling magneto-resistance elements TMR0 share digit line DL<0>. Other tunneling magneto-resistance elements TMR1 to TMR3 similarly share digit lines DL<1> to DL<3> in memory cells MC0, MC1.

Though not shown, one end side of digit lines DL<1> to DL<3> is electrically coupled to power supply voltage Vcc, and a plurality of transistors 40 connected to fixed voltage Vss are provided on the other side. The gate of each transistor 40 turns on, upon receiving inputs of row selection signals WD<0> to WD<3> corresponding to digit lines DL<0> to DL<3> respectively, and the data write current flows through digit line DL.

In addition, as two memory cells MC0, MC1 adjacent along the memory cell row are configured to share source line SL, the number of interconnections can be suppressed and sufficient interconnection pitch can be ensured.

Moreover, the access transistors of two adjacent memory cells MC are electrically coupled to word lines WL<0> and WL<1> different from each other, respectively.

A cross-sectional configuration of memory cell MC according to the first embodiment of the present invention will be described with reference to FIG. 9.

Figure 9:
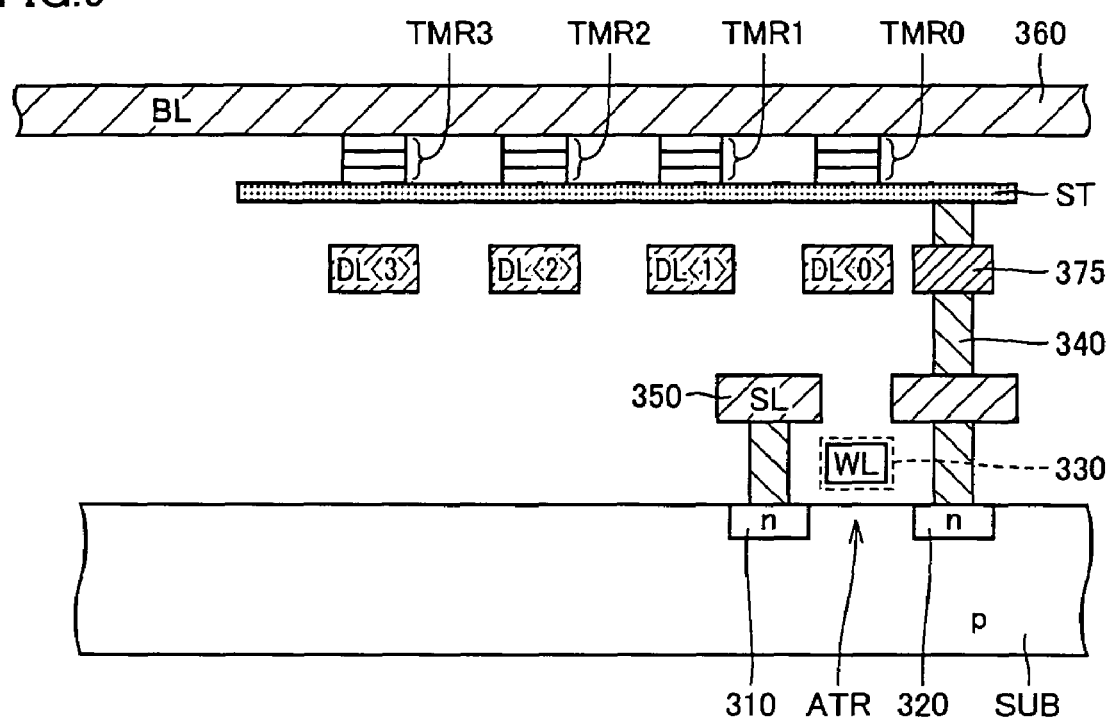
FIG. 9 illustrates a cross-sectional configuration of the memory cell according to the first embodiment of the present invention.

Referring to FIG. 9, access transistor ATR formed on a semiconductor substrate SUB has source/drain regions 310 and 320 serving as an n-type region and a gate region.

Word line WL serving as the gate of access transistor ATR is formed above a p-type gate region.

Source/drain region 310 is electrically coupled to source line SL formed in a first-layer metal interconnection layer 350. Digit line DL is formed in a second-layer metal interconnection layer 375 above first-layer metal interconnection layer 350.

Tunneling magneto-resistance element TMR is arranged on the upper layer side of digit line DL. Specifically, tunneling magneto-resistance elements TMR0 to TMR3 are provided on the upper layer side of digit lines DL<0> to DL<3> respectively. In addition, tunneling magneto-resistance elements TMR0 to TMR3 are electrically coupled to source/drain region 320 of access transistor ATR through a strap ST and a contact hole 340. Strap ST is provided in order to electrically couple tunneling magneto-resistance elements TMR0 to TMR3 to access transistor ATR, and formed from a conductive material.

Bit line BL is electrically coupled to tunneling magneto-resistance elements TMR0 to TMR3, and formed in a third-layer metal interconnection layer 360 on tunneling magneto-resistance elements TMR0 to TM1. On the other hand, as word line WL is provided in order to control the gate voltage of access transistor ATR, it is not necessary to positively flow the current. Therefore, from the viewpoint of higher integration, word line WL is generally formed from a polysilicon layer or a polycide layer in the interconnection layer where a gate 330 is provided, without newly providing an independent metal interconnection layer.

A layout of memory cell MC according to the first embodiment of the present invention will be described with reference to FIG. 10. Here, a layout configuration when the device is viewed from above is shown.

Figure 10:
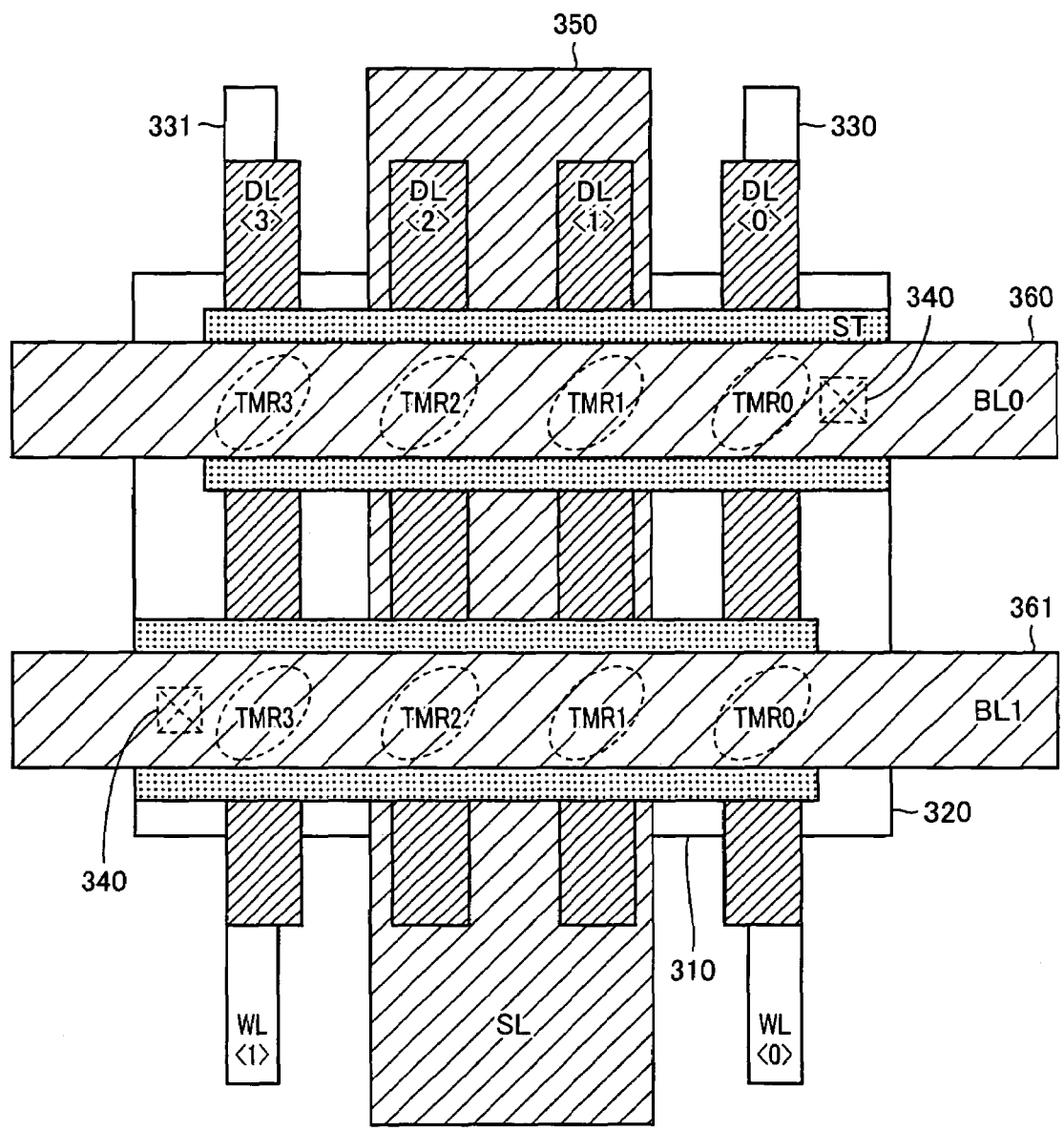
FIG. 10 illustrates a layout of the memory cell according to the first embodiment of the present invention.

Referring to FIG. 10, third-layer metal interconnection layers 360, 361 forming bit lines BL0, BL1 respectively are formed in the upper layer. Tunneling magneto-resistance elements TMR0 to TMR3 are sandwiched between third-layer metal interconnection layers 360, 361 and strap ST. Strap ST is coupled to source/drain region 320 serving as the n-type region through contact hole 340. Under strap ST, second-layer metal interconnection layer 375 is used to provide digit lines DL<0> to DL<3> corresponding to tunneling magneto-resistance elements TMR0 to TMR3 respectively. In a further lower portion, gate 330 forming word line WL electrically coupling source/drain regions 310, 320 is provided. Here, word line WL<0> provided corresponding to memory cell MC0 and word line WL<1> provided corresponding to memory cell MC1 are shown. In addition, source line SL electrically coupled to source/drain region 310 is formed with the use of first-layer metal interconnection layer 350.

Integration of a memory cell can be improved by such a configuration that one access transistor is shared by a plurality of tunneling magneto-resistance elements TMR, as according to the embodiment of the present invention. Integration of a memory cell can be improved particularly by reducing a size of the access transistor, however, reduction in the size thereof is limited. In many cases, the cell pitch depends not on a size of the tunneling magneto-resistance element but on a size of the access transistor. Therefore, a plurality of tunneling magneto-resistance elements are arranged in accordance with the size of the access transistor, so that a non-volatile memory device achieving low area penalty and higher integration can be implemented.

Figure 11:
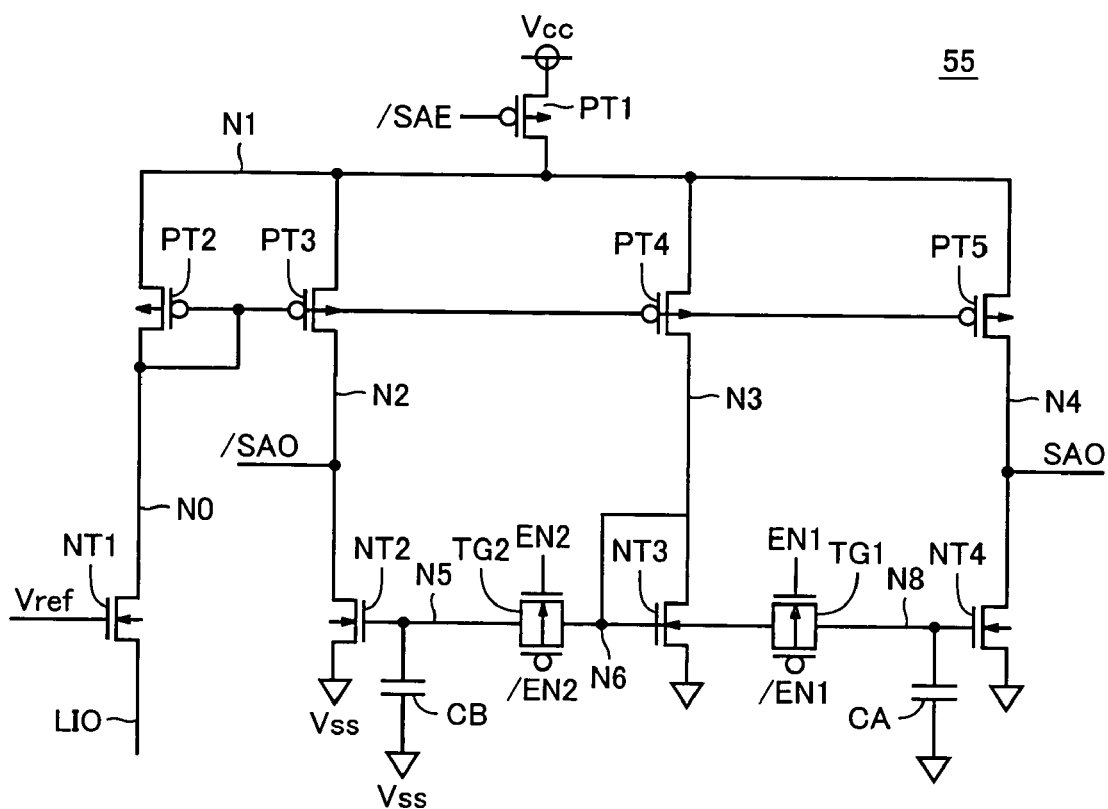
FIG. 11 is a circuit diagram showing configuration of a comparison portion according to the first embodiment of the present invention.

Referring to FIG. 11, a comparison portion 55 according to the first embodiment of the present invention includes transistors PT1 to PT5, transistors NT1 to NT4, transfer gates TG1, TG2, and capacitors CA, CB.

Transistor PT2 is arranged between a node N1 and a node N0, and has the gate electrically coupled to node N0. Transistor NT1 is arranged between node N0 and data line LIO, and the gate thereof receives an input of a reference voltage Vref Reference voltage Vref is a control voltage controlling data line LIO to attain a prescribed voltage level. Transistor PT1 is arranged between power supply voltage Vcc and node N1, and the gate thereof receives an input of control signal /SAE. Transistor PT3 is arranged between node N1 and a node N2, and the gate thereof receives an input from node N0. Transistor PT4 is arranged between node N1 and a node N3, and has the gate electrically connected to node N0. Transistor PT5 is arranged between node N1 and a node N4, and has the gate electrically coupled to node N0. Transistor NT2 is arranged between node N2 and fixed voltage Vss, and has the gate electrically coupled to a node N5.

Capacitor CB is arranged between node N5 and fixed voltage Vss. Transfer gate TG2 is arranged between node N5 and a node N6, and the gate thereof receives inputs of control signals EN2, /EN2. Transistor NT3 is arranged between node N3 and fixed voltage Vss, and has the gate electrically coupled to node N6. Transfer gate TG1 is arranged between node N6 and a node N8, and the gate thereof receives inputs of control signals EN1, /EN1. Capacitor C A is arranged between node N8 and fixed voltage Vss. Transistor NT4 is arranged between node N4 and fixed voltage Vss, and has the gate electrically coupled to node N8.

Comparison portion 55 according to the embodiment of the present invention accumulates charges in capacitors CA, CB based on a through current that flows through the memory cell, and outputs comparison data SAO, /SAO based on the charges accumulated in capacitors CA, CB to amplification portion 60.

A specific operation will be described hereinafter.

In data reading, initially, control signal /SAE is set to "L" level. Accordingly, transistor PT1 turns on, and power supply voltage Vcc is electrically coupled to node N1. Then, an operation voltage is supplied and data reading is performed. Thereafter, initially, control signals EN1, /EN1 are set to "H" level and "L" level respectively. On the other hand, as will be described later, in the first data read operation, control signals EN2, /EN2 are set to "L" level and "H" level respectively. Namely, transfer gate TG1 has turned on, and node N6 and node N8 are electrically coupled to each other. On the other hand, transfer gate TG2 has turned off, and node N5 is electrically disconnected from node N6.

In this state, when the current is supplied to the selected memory cell through data line LIO, the current in the same amount flows, because transistors PT2, PT4 constitute a current mirror circuit. In addition, as described above, node N6 is electrically coupled to node N8, and the current in the same amount flows, because transistors NT3, NT4 also constitute a current mirror circuit. Therefore, capacitor CA accumulates charges based on the current that flows through data line LIO in the first data read operation.

On the other hand, in the second data read operation, control signals EN2, /EN2 are set to "H" level and "L" level respectively, while control signals EN1, /EN1 are set to "L" level and "H" level respectively. Namely, transfer gate TG2 has turned on, and node N5 and node N6 are electrically coupled to each other. On the other hand, transfer gate TG1 has turned off, and node N6 is electrically disconnected from node N8.

In this state, when the current is supplied to the selected memory cell through data line LIO, the current in the same amount flows, because transistors PT2, PT4 constitute a current mirror circuit. In addition, as described above, node N5 is electrically coupled to node N6, and the current in the same amount flows, because transistors NT2, NT3 also constitute a current mirror circuit. Therefore, capacitor CB accumulates charges based on the current that flows through data line LIO in the second data read operation.

Transistors NT2, NT4 turn on based on the charges accumulated in capacitors CA, CB, and output comparison data signals SAO, /SAO in accordance with comparison.

Figure 12:
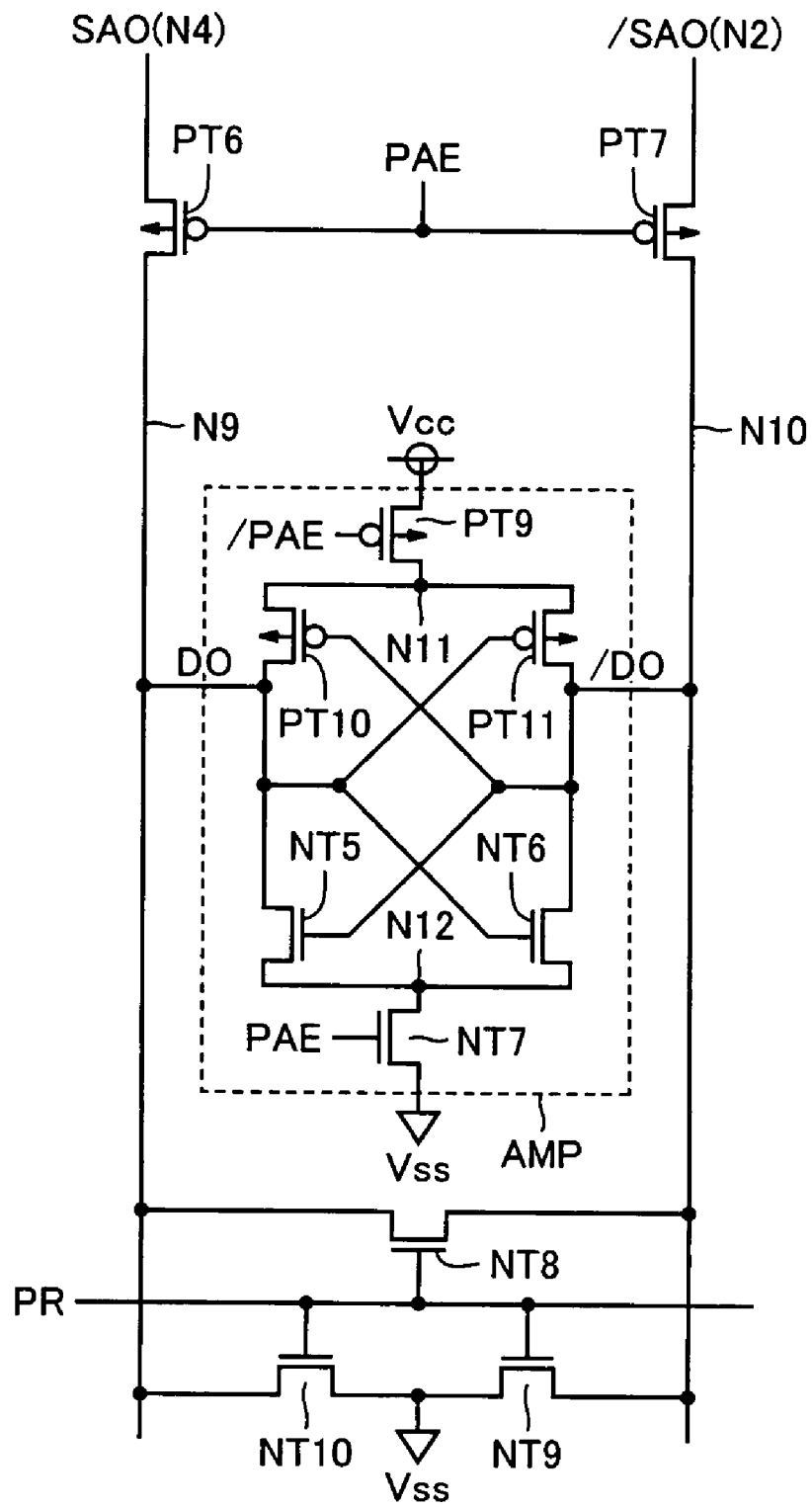
FIG. 12 is a circuit diagram showing configuration of an amplification portion according to the first embodiment of the present invention.

Referring to FIG. 12, amplification portion 60 according to the first embodiment of the present invention includes transistors PT6, PT7, PT10, PT11 and transistors NT5 to NT10. Transistors NT8 to NT10 are provided in order to short-circuit a node N9 and a node N10 to each other. Transistor NT8 is arranged between node N9 and node N11, and the gate thereof receives an input of a control signal PR. Transistor NT9 is arranged between node N10 and fixed voltage Vss, and the gate thereof receives an input of control signal PR. Transistor NT10 is arranged between node N9 and fixed voltage Vss, and the gate thereof receives an input of control signal PR.

When control signal PR is at "H" level, transistors NT8 to NT10 all turn on, and node N9 and N10 are short-circuited and coupled to the fixed voltage, which leads to discharging.

Transistor PT7 is arranged between node N2 and node N11, and the gate thereof receives an input of a control signal PAE. Transistor PT6 is arranged between node N4 and node N9, and the gate thereof receives an input of control signal PAE. Transistors PT6, PT7 turn on when control signal PAE is at "L" level, and electrically couple comparison portion 55 and amplification portion 60 to each other.

On the other hand, when control signal PAE is at "H" level, these transistors turn off, and comparison portion 55 is electrically disconnected from amplification portion 60.

An amplifier AMP is implemented by what is called a cross-latch type sense amplifier, which amplifies a signal transmitted to nodes N9 and N10 for output as read data DO, /DO.

Amplifier AMP includes transistors PT9 to PT 11 and transistors NT5 to NT7. Transistor PT9 is arranged between power supply voltage Vcc and a node N11, and the gate thereof receives an input of a control signal /PAE. Control signal /PAE is an inverted signal of control signal PAE. Transistor PT1 is arranged between node N11 and node N9, and the gate thereof receives an input from node N1. Transistor PT11 is arranged between node N11 and node N10, and the gate thereof receives an input from node N9. Transistor NT5 is arranged between node N9 and a node N12, and the gate thereof receives an input from node N1. Transistor NT6 is arranged between node N10 and node N12, and has the gate electrically coupled to node N9.

Transistor NT7 is arranged between node N12 and fixed voltage Vss, and the gate thereof receives the input of control signal PAE.

Before data reading, control signal PAE is set to "L" level, and node N9 and node N10 are set to be equipotential. In data reading, control signal PAE is set to "H" level, and node N9 is disconnected from node N10. In addition, amplifier AMP is activated to amplify comparison data signals SAO, /SAO transmitted to nodes N9, N10 and to output the signals as read data DO, /DO.

Figure 13:
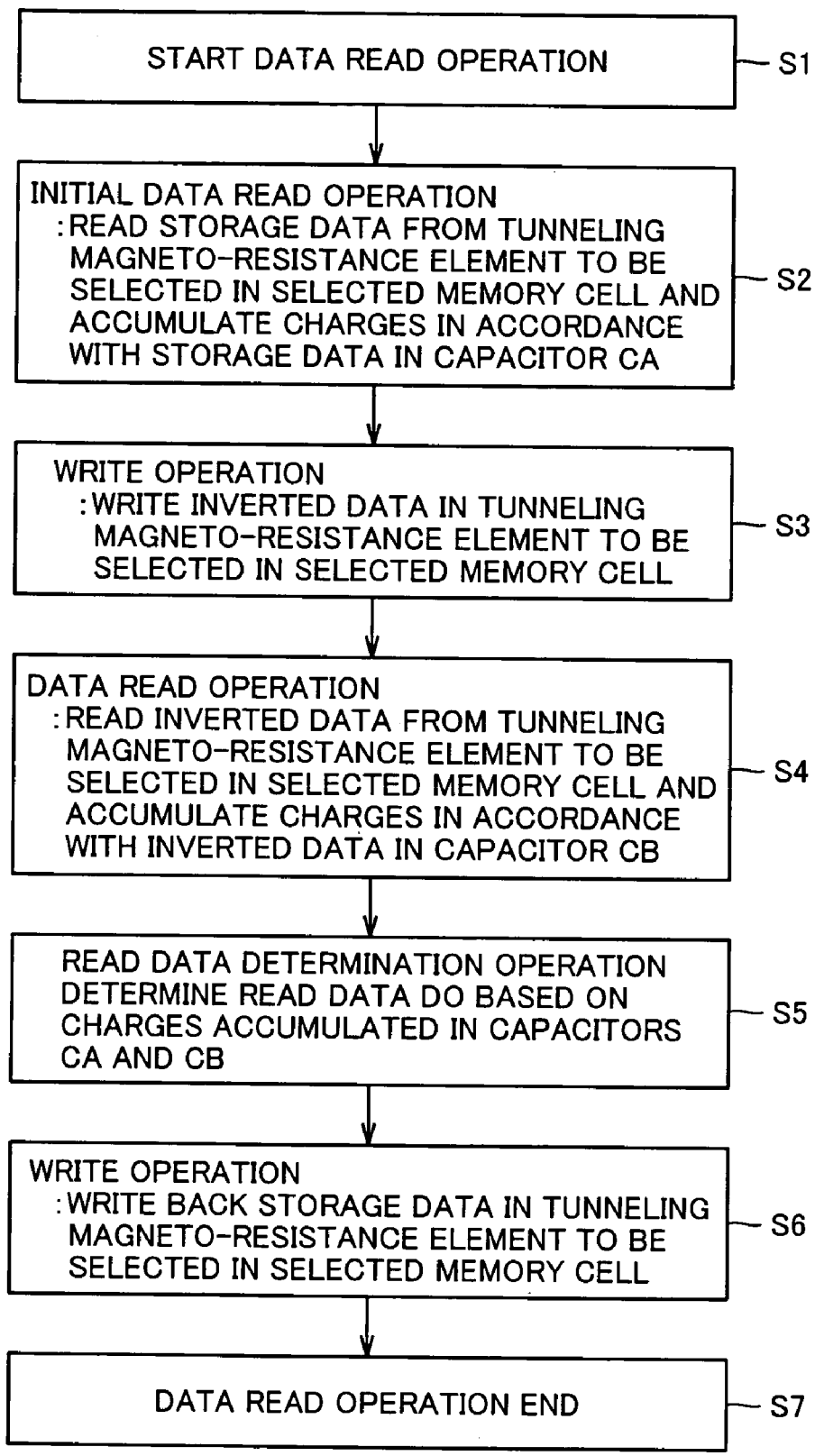
FIG. 13 is a flowchart illustrating a data read operation according to the first embodiment of the present invention.

The data read operation according to the first embodiment of the present invention will be described with reference to FIG. 13.

In the first embodiment, 1-bit data reading from the memory cell to be selected will be described. In the following, attention will be paid mainly to tunneling magneto-resistance element TMR0 among the plurality of tunneling magneto-resistance elements TMR0 to TMR3 included in memory cell MC0.

The data read operation is started (step S1), and the initial data read operation is performed (step S2). Specifically, storage data is read from the tunneling magneto-resistance element to be selected in the selected memory cell, and charges in accordance with the storage data is accumulated in capacitor CA. Specifically, word line WL is activated ("H" level), and a current path is formed between source line SL and bit line BL0. In addition, read selection signal RCSL is set to "H" level, bit line BL and data line LIO are electrically coupled to each other, and the through current in accordance with the storage data of the tunneling magneto-resistance element is supplied from data read circuit RDC.

Data reading from tunneling magneto-resistance element TMR0 (high resistance RH) of the memory cell according to the first embodiment of the present invention will be described with reference to FIG. 14.

In the present embodiment, for example, attention will be paid to tunneling magneto-resistance element TMR0 as the tunneling magneto-resistance element to be selected in the selected memory cell.

Specifically, a prescribed voltage is applied to bit line BL in data reading, and the through current in accordance with a resistance value of each tunneling magneto-resistance element flows through each tunneling magneto-resistance element TMR0 to TMR3. For example, it is assumed that a current I0 flows through tunneling magneto-resistance element TMR0 having high resistance RH and that a current IA flows through tunneling magneto-resistance elements TMR1 to TMR3. Here, current IA+I0 flows through memory cell MC as a whole. Then, comparison portion 55 accumulates in capacitor CA, charges corresponding to current IA+I0 that flows as described above.

Referring again to FIG. 13, as the write operation, inverted data is written in the tunneling magneto-resistance element to be selected in the selected memory cell (step S3). Specifically, as described above, prescribed data write magnetic field is applied to the tunneling magneto-resistance element to be selected, using a prescribed pulse sequence. Accordingly, the free layer of the tunneling magneto-resistance element has a magnetic direction opposite to the magnetic direction prior to writing. Therefore, the magnetic direction of tunneling magneto-resistance element TMR0 described with reference to FIG. 14 is reversed, and the resistance is set to a low resistance RL.

Thereafter, the data read operation is performed (step S4). Specifically, the inverted data is read from the tunneling magneto-resistance element to be selected in the selected memory cell, and charges in accordance with the inverted data are accumulated in capacitor CB.

Data reading from tunneling magneto-resistance element TMR0 (low resistance RL) of the memory cell according to the first embodiment of the present invention will be described with reference to FIG. 15.

In the present embodiment, for example, attention will be paid to tunneling magneto-resistance element TMR0 as the tunneling magneto-resistance element to be selected in the selected memory cell.

In data reading, a prescribed voltage is applied to bit line BL, and the through current in accordance with the resistance value of each tunneling magneto-resistance element flows through each tunneling magneto-resistance element TNM0 to TMR3. Therefore, as described above, a current I1 flows through tunneling magneto-resistance element TMR0. In addition, current IA flows through tunneling magneto-resistance elements TMR1 to TMR3. Here, current IA+I1 flows through memory cell MC as a whole.

In general, an MR ratio of tunneling magneto-resistance element TMR is set to approximately 20%. Therefore, by writing the inverted data described above, variation in the current in accordance with the MR ratio can be detected with regard to current I0 and current I1. Namely, sufficient data read margin can be ensured.

Here, as described above, comparison portion 55 accumulates in capacitor CB, charges in accordance with current IA+I1 that flows.

Thereafter, a read data determination operation is performed (step S5). Specifically, read data DO is determined based on the charges accumulated in capacitors CA and CB. Specifically, the prescribed operation described above is performed in data read circuit RDC, so that read data DO is output.

Thereafter, the write operation is performed (step S6). Specifically, the storage data is written back into the tunneling magneto-resistance element to be selected in the selected memory cell. The data read operation is thus ended (step S7).

Figure 16:
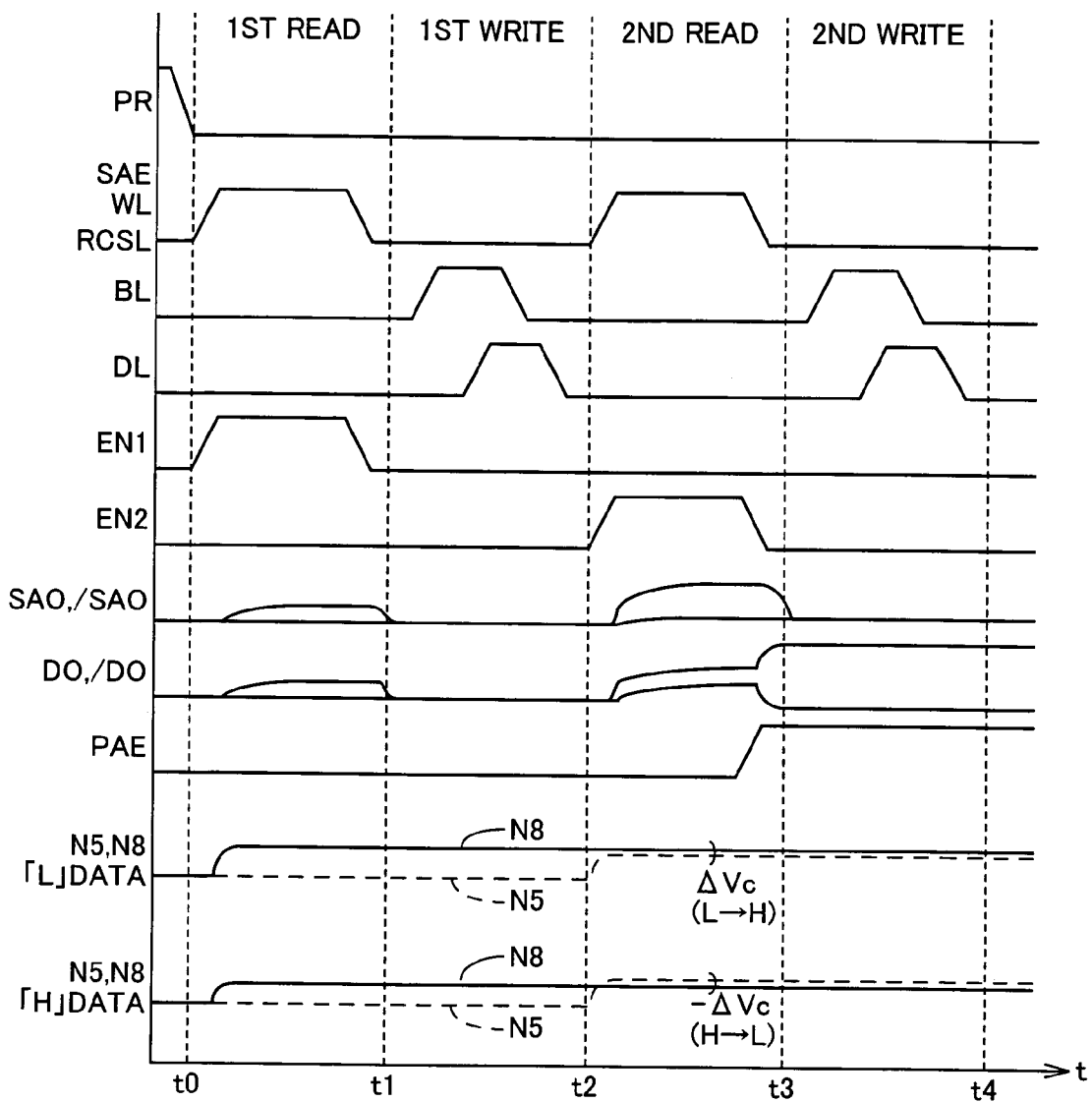
FIG. 16 is a timing chart of the data read operation according to the first embodiment of the present invention, specifically illustrating a series of data read operations above.

The data read operation according to the first embodiment of the present invention will be described with reference to a timing chart shown in FIG. 16. The series of data read operations described above will specifically be described.

Initially, at time t0, the first initial data read operation (1st read) is started. Specifically, control signal PR is set from "H" level to "L" level. Accordingly, equalization and discharge of nodes N9 and N10 ends, and node N9 is electrically disconnected from node N10. In addition, control signal SAE, word line WL and read selection signal RCSL are activated ("H" level). Specifically, access transistor ATR turns on by word line WL (H level), and bit line BL and source line SL are electrically coupled to each other through tunneling magneto-resistance element TMR. In addition, bit line BL and data line LIO are electrically coupled to each other by read selection signal RCSL ("H" level). Control signal SAE is set to "H" level, and control signal /SAE is set to "L" level. Power supply voltage Vcc is thus supplied to comparison portion 55. Namely, the current path is formed between power supply voltage Vcc and fixed voltage Vss through tunneling magneto-resistance element TMR. The through current in accordance with the resistance value of tunneling magneto-resistance element TMR thus flows. Then, control signal EN1 is set to "H" level, and charges in accordance with the through current are accumulated in capacitor CA. For example, when tunneling magneto-resistance element TMR has low resistance RL ("L" data), current IA+I1 flows. The charges in accordance with this current amount are accumulated in capacitor CA, and a potential of node N8 is set. On the other hand, when tunneling magneto-resistance element TMR has high resistance RH ("H" data), current IA+I0 flows. The charges in accordance with this current amount are accumulated in capacitor CA, and the potential of node N8 is set.

At time t1, the write operation (1st write) is performed. Specifically, the data of tunneling magneto-resistance element TMR to be selected is inverted by the prescribed pulse sequence described above.

At time t2, the second data read operation (2nd read) is performed. Specifically, the current path is formed between power supply voltage Vcc and fixed voltage Vss through tunneling magneto-resistance element TMR as described above. The through current in accordance with the resistance value of tunneling magneto-resistance element TMR thus flows. Then, control signal EN2 is set to "H" level, and charges in accordance with the through current are accumulated in capacitor CB. For example, when tunneling magneto-resistance element TMR has low resistance RL ("H" data) as a result of inversion, current IA+I1 flows. The charges in accordance with this current amount are accumulated in capacitor CB, and the potential of node N5 is set. On the other hand, when tunneling magneto-resistance element TMR has high resistance RH ("L" data) as a result of inversion, current IA+I0 flows. The charges in accordance with this current amount are accumulated in capacitor CB, and the potential of node N5 is set.

Thereafter, comparison data signals SAO, /SAO are amplified in accordance with the charges accumulated in capacitors CA and CB, that is, in accordance with the potentials of node N5 and node N8, and transmitted to amplification portion 60. Before time t3, in response to control signal PAE ("H" level), an amplifying operation is performed in amplifier AMP, whereby read data DO is output. If the storage data of tunneling magneto-resistance element TMR is "L" data, node N8 has the potential level higher than that of node N5. Accordingly, comparison data SAO, /SAO are set to "L" level and "H" level respectively. Then, the comparison data is further amplified by amplification portion 60 in a subsequent stage, and read data DO, /DO are set to "L" level and "H" level respectively. On the other hand, if the storage data of tunneling magneto-resistance element TMR is "H" data, node N8 has the potential level lower than that of node N5. Accordingly, comparison data SAO, /SAO are set to "H" level and "L" level respectively. Then, the comparison data is further amplified by amplification portion 60 in a subsequent stage, and read data DO, /DO are set to "H" level and "L" level respectively.

At time t3, the write operation (2nd write) is performed along with the read data determination operation.

Specifically, as the data has been inverted in the preceding write operation, the original storage data can be recovered by performing again the write operation.

Data reading from the tunneling magneto-resistance element to be selected in the selected memory cell can be performed as described above. In other words, 1-bit data reading can be performed.

The data write operation according to the first embodiment of the present invention will be described with reference to a flowchart shown in FIG. 17.

Figure 17:
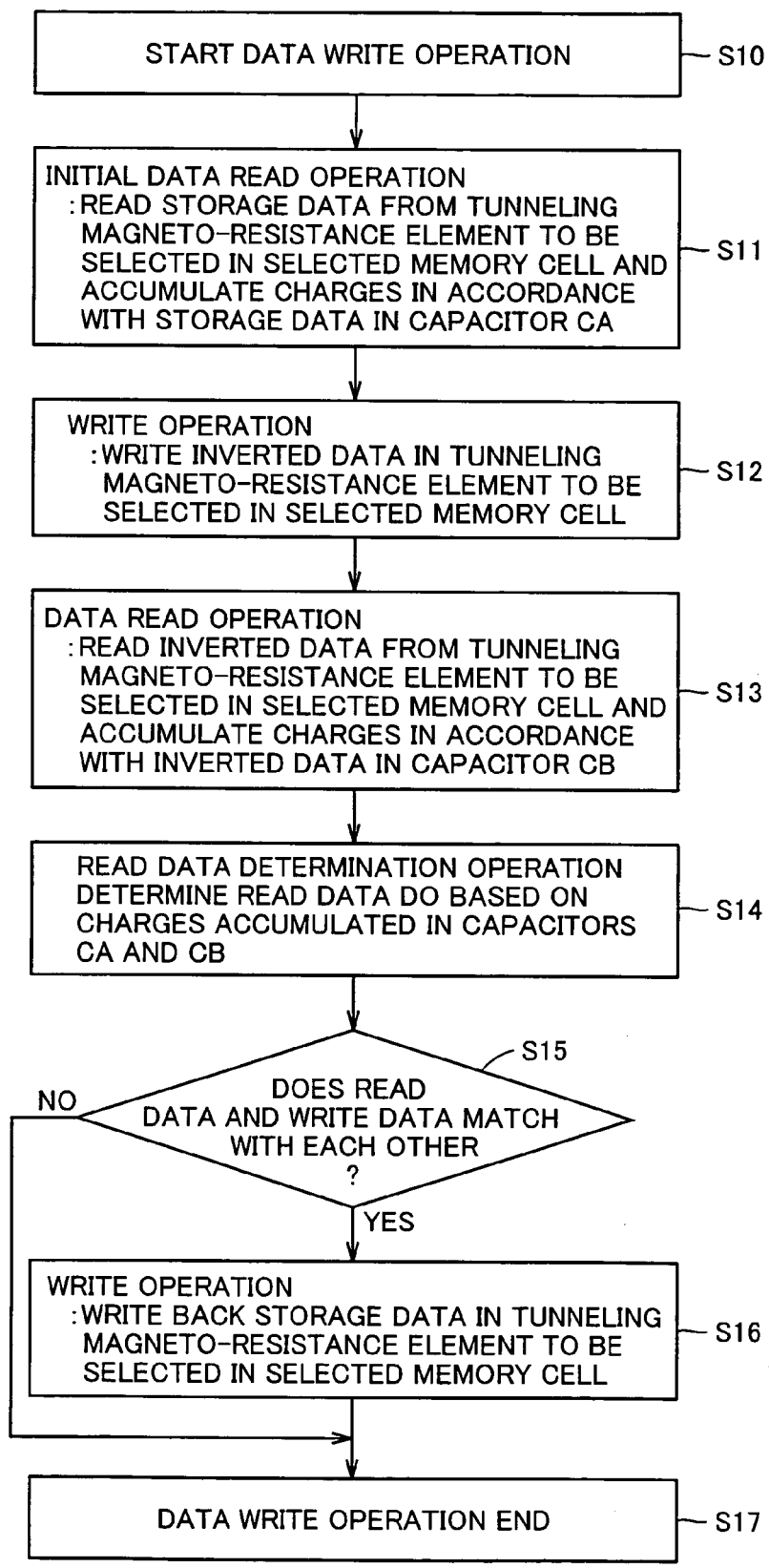
FIG. 17 is a flowchart illustrating a data write operation according to the first embodiment of the present invention.

Referring to FIG. 17, the data write operation is started (step S10). Here, whether the initial storage data is "0" or "1" should be determined. As the initial data read operation (step S11), the write operation (step S12), the data read operation (step S13), and the read data determination operation (step S14) are the same as described with regard to steps S2 to S5 above, detailed description thereof will not be repeated.

At step S15, whether read data DO matches the write data is determined. If they match with each other, the write operation is performed (step S16).

On the other hand, if read data DO does not match the write data at step S15, the write operation is skipped and ended (step S17).

The reason why the write operation is performed when the read data matches the write data is that the data level of the current tunneling magneto-resistance element has been inverted in the preceding write operation (step S12) and the original storage data should be recovered.

On the other hand, the reason why the write operation (step S16) is skipped when the read data does not match the write data is that the data level of the current tunneling magneto-resistance element has been inverted in the preceding write operation (step S12) and it is no longer necessary to further perform the write operation (step 16). In this manner, an unnecessary write operation is stopped and power consumption can be reduced.

As described above, according to the data read scheme and the data write scheme of the first embodiment, self-reference data reading and data writing can be performed also in the toggle cell in which the access transistor is shared by the plurality of tunneling magneto-resistance elements.

Variation of First Embodiment

In the first embodiment described above, the structure in which a plurality of tunneling magneto-resistance elements TMR are provided in the same position in parallel to each other in one memory cell has exemplarily been discussed.

In the variation of the first embodiment of the present invention, a structure in which a plurality of tunneling magneto-resistance elements are stacked will be described.

Figure 18:
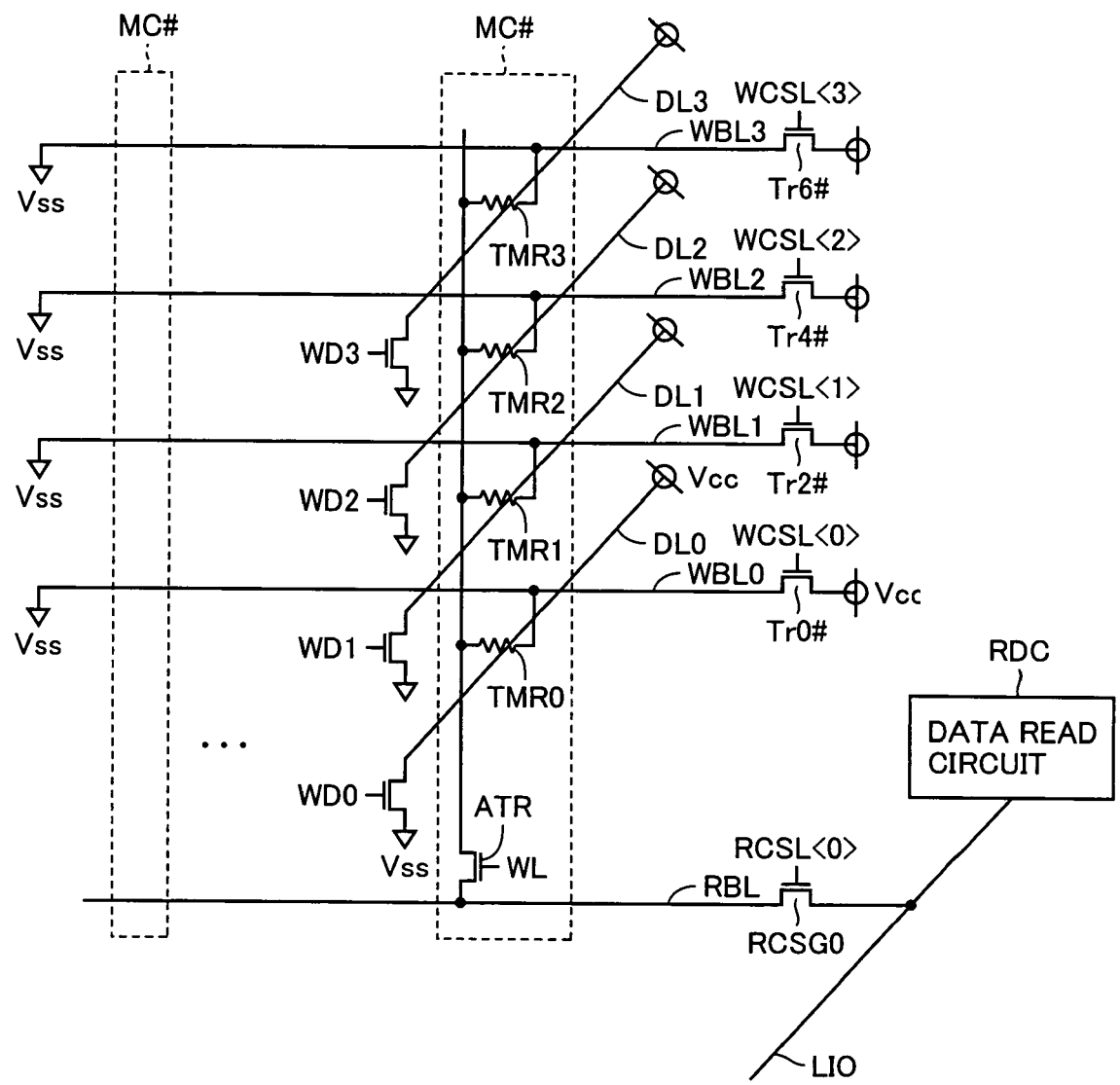
FIG. 18 illustrates a memory cell and its peripheral circuit according to the first embodiment of the present invention.

Referring to FIG. 18, a memory cell MC# according to the first embodiment of the present invention includes a plurality of tunneling magneto-resistance elements TMR0 to TMR3 and access transistor ATR. In addition, FIG. 18 shows a circuit configuration where tunneling magneto-resistance elements TMR are stacked. Write bit lines WBL0 to WBL3 and digit lines DL0 to DL3 through which a data write current flows are provided corresponding to tunneling magneto-resistance elements TMR0 to TMR3 respectively.

In addition, access transistor ATR is provided in common to tunneling magneto-resistance elements TMR0 to TMR3, and the gate thereof is electrically coupled to word line WL. The access transistor turns on in response to activation of word line WL, and a read bit line RBL and each tunneling magneto-resistance element TMR are electrically coupled to each other.

Driver transistors Tr0#, Tr2#, Tr4#, Tr6# for pull-up of write bit lines WBL0 to WBL3 are provided on one end sides of write bit lines WBL0 to WBL3 respectively. The gates of driver transistors Tr0#, Tr2#, Tr4#, Tr6# receive write control signals WCSL<0> to WCSL<3> respectively. The other end sides of write bit lines WBL0 to WBL3 are electrically coupled to fixed voltage Vss. For example, when write control signal WCSL<0> is at "H" level, driver transistor Tr0# turns on and the data write current flows through write bit line WBL0.

Read bit line RBL is provided corresponding to each memory cell column, and electrically coupled to data line LIO through read selection gate RCSG0. Read selection gate RCSG0 electrically couples read bit line RBL and data line LIO to each other, in response to a column selection signal RCSL<0>. Data line LIO is connected to data read circuit RDC. As data read circuit RDC is the same as described in the first embodiment, detailed description thereof will not be repeated.

A cross-section of memory cell MC# illustrated in FIG. 18 will be described with reference to FIG. 19.

Figure 19:
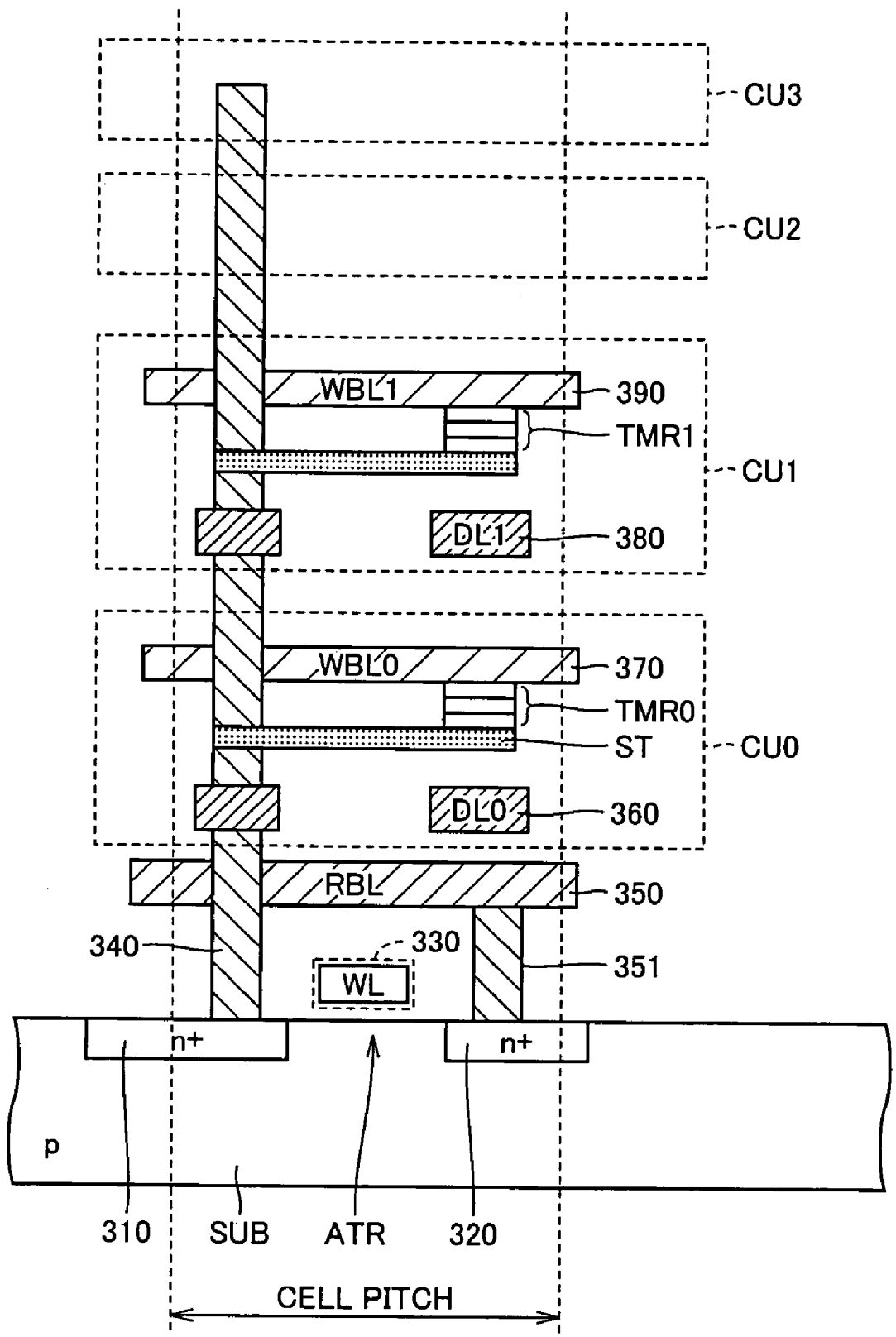
FIG. 19 shows a cross-section of the memory cell illustrated in FIG. 18.

Referring to FIG. 19, memory cell MC# is implemented by a cell unit CU including tunneling magneto-resistance element TMR. Specifically, in the present example, cell units CU0 to CU3 including tunneling magneto-resistance elements TMR0 to TMR3 respectively are shown. That is, the configuration in which cell units CU are stacked is shown.

Access transistor ATR formed on semiconductor substrate SUB has source/drain regions 310 and 320 serving as an n-type region and a gate region.

Word line WL serving as the gate of access transistor ATR is formed above a p-type gate region.

Source/drain region 320 is electrically coupled to read bit line RBL formed in first-layer metal interconnection layer 350 through a contact hole 351. Source/drain region 310 is electrically coupled to cell units CU0 to CU3 in the upper layer through contact hole 340. As word line WL is provided in order to control the gate voltage of access transistor ATR, it is not necessary to positively flow the current. Therefore, from the viewpoint of higher integration, word line WL is generally formed from a polysilicon layer or a polycide layer in the interconnection layer where gate 33.0 is provided, without newly providing a metal interconnection layer.

Cell unit CU is constituted of tunneling magneto-resistance element TMR, write bit line WBL and digit line DL. Specifically, digit line DL is provided in second-layer metal interconnection layer 360. In cell unit CU0, tunneling magneto-resistance element TMR0 is arranged on the upper layer side of digit line DL0. Tunneling magneto-resistance element TMR0 is electrically coupled to source/drain region 310 of access transistor ATR through strap ST and contact hole 340. Strap ST is provided in order to electrically couple tunneling magneto-resistance elements TMR0 to TMR3 to access transistor ATR, and formed from a conductive material. Write bit line WBL is provided in a third-layer metal interconnection layer 370, and electrically coupled to tunneling magneto-resistance element TMR0.

Other cell units CU1 to CU3 are implemented in a manner the same as described with regard to CU0. For example, in cell unit CU1, a digit line is provided in a fourth-layer metal interconnection layer 380, and write bit line WBL is provided in a fifth-layer metal interconnection layer 390.

In the configuration of memory cell MC# according to the variation of the first embodiment of the present invention as well, one access transistor is shared by the plurality of tunneling magneto-resistance elements TMR, so that integration of a memory cell can be improved. Improvement in integration can be achieved particularly by reducing the size of the access transistor, however, reduction in size thereof is limited as described above. Therefore, in the configuration according to the variation of the first embodiment of the present invention, cell units CU are stacked above the access transistor, so that the number of parts can be reduced and a non-volatile memory device achieving low area penalty and higher integration can be implemented.

The scheme similar to the data read scheme described with reference to FIG. 13 of the first embodiment is applied also to memory cell MC# according to the variation of the first embodiment of the present invention.

Data reading from memory cell MC# according to the variation of the first embodiment of the present invention will be described with reference again to FIG. 13.

The data read operation is started (step S1), and the initial data read operation is performed (step S2). Specifically, word line WL is activated, and read bit line RBL and cell unit CU are electrically coupled to each other through access transistor ATR. Here, the other end side of each write bit line WBL is electrically coupled to fixed voltage Vss in cell unit CU, and a current path is formed between read bit line RBL and write bit line WBL in response to activation of word line WL. In addition, as described above, read selection gate RCSG turns on in response to read selection signal RCSL ("H" level), and read bit line RBL and data line LIO are electrically coupled to each other. Namely, the current path to data read circuit RDC is formed.

Figure 20:
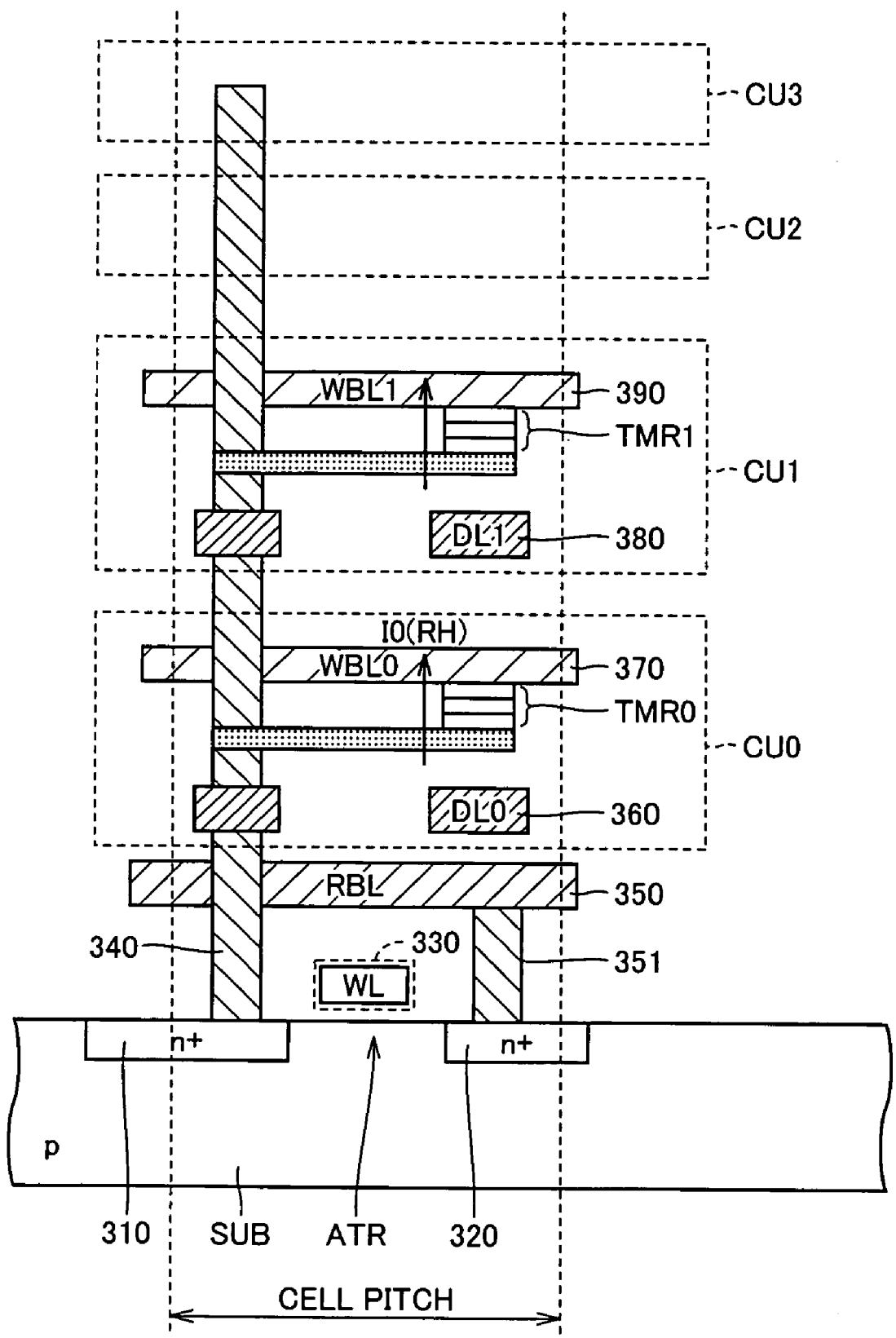
FIGS. 20 and 21 illustrate data reading from a tunneling magneto-resistance element (low resistance) of the memory cell according to a variation of the first embodiment of the present invention.

Data reading from tunneling magneto-resistance element TMR0 (low resistance RH) of memory cell MC# according to the variation of the first embodiment of the present invention will be described with reference to FIG. 20.

In the present embodiment, for example, attention will be paid to tunneling magneto-resistance element TMR0 as the tunneling magneto-resistance element to be selected in the selected memory cell.

A prescribed voltage is applied to read bit line RBL in data reading, and the through current in accordance with the resistance value of each tunneling magneto-resistance element flows through each tunneling magneto-resistance element TMR0 to TMR3. For example, it is assumed that current I0 flows through tunneling magneto-resistance element TMR0 having high resistance RH and that the through current in accordance with the resistance value similarly flows through other tunneling magneto-resistance elements TMR1 to TMR3. For example, it is assumed that current IA flows through tunneling magneto-resistance elements TMR1 to TMR3. Here, current IA+I0 flows through memory cell MC as a whole. Then, comparison portion 55 accumulates in capacitor CA, charges corresponding to current IA+I0 that flows as described above.

Referring again to FIG. 13, as the write operation, inverted data is written in the tunneling magneto-resistance element to be selected in the selected memory cell (step S3). Specifically, as described above, prescribed data write magnetic field is applied to the tunneling magneto-resistance element to be selected, using a prescribed pulse sequence. Accordingly, the free layer of the tunneling magneto-resistance element has a magnetic direction opposite to the initial magnetic direction as described above. Therefore, the magnetic direction of tunneling magneto-resistance element TMR0 described with reference to FIG. 20 is reversed, and the resistance is set to low resistance RL.

Thereafter, the data read operation is performed (step S4). Specifically, the inverted data is read from the tunneling magneto-resistance element to be selected in the selected memory cell, and charges in accordance with the inverted data are accumulated in capacitor CB.

Figure 21:
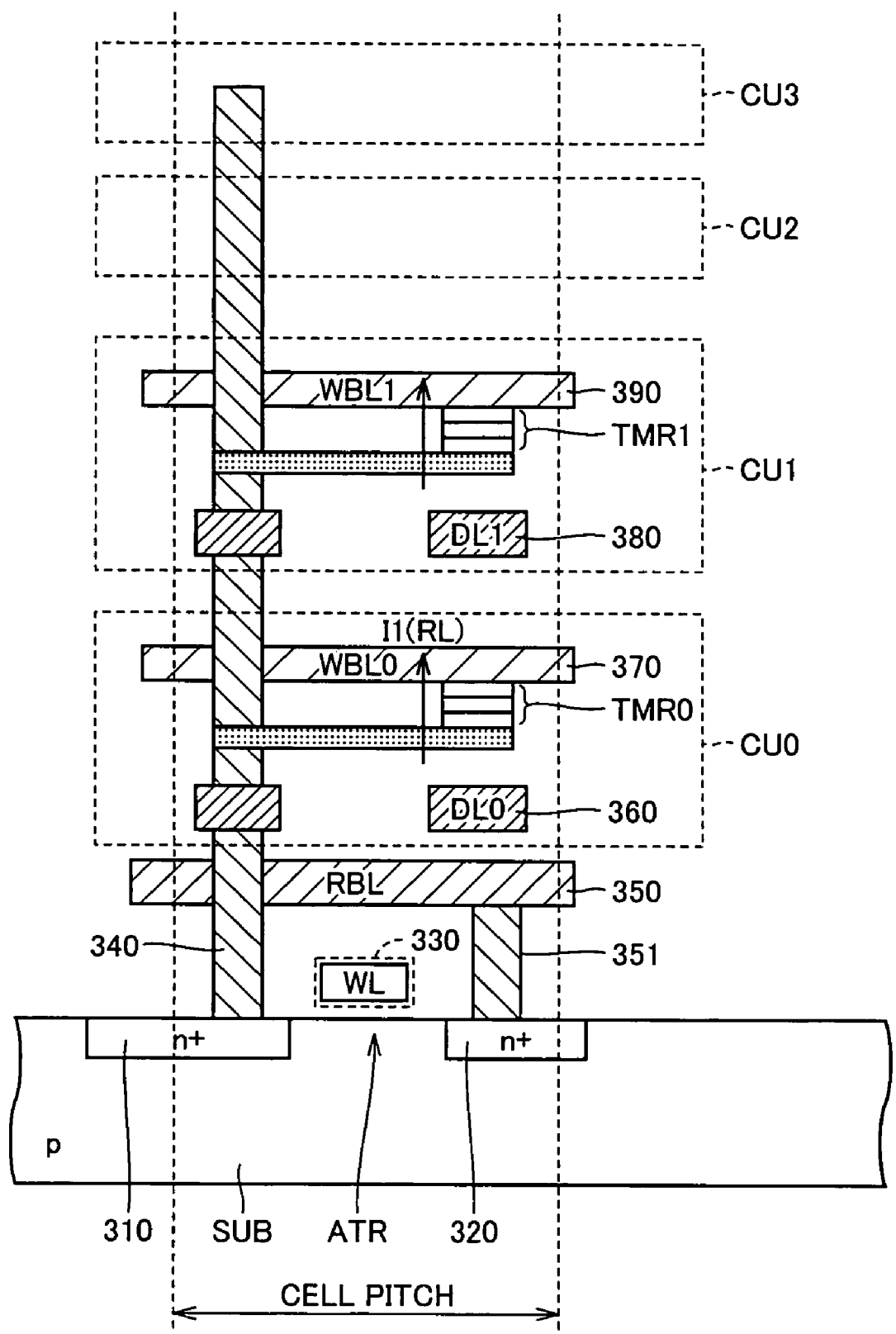

Data reading from tunneling magneto-resistance element TMR0 (low resistance RL) of memory cell MC# according to the variation of the first embodiment of the present invention will be described with reference to FIG. 21.

In the present embodiment, for example, attention will be paid to tunneling magneto-resistance element TMR0 as the tunneling magneto-resistance element to be selected in the selected memory cell.

In data reading, a prescribed voltage is applied to read bit line RBL, and the through current in accordance with the resistance value of each tunneling magneto-resistance element flows through each tunneling magneto-resistance element TMR0 to TMR3. Therefore, as described above, current I1 flows through tunneling magneto-resistance element TMR0. In addition, current IA flows through tunneling magneto-resistance elements TMR1 to TMR3. Here, current IA+I1 flows through memory cell MC as a whole.

Here, as described above, comparison portion 55 accumulates in capacitor CB, charges corresponding to current IA+I1 that flows.

Thereafter, the read data determination operation is performed (step S5). Specifically, read data DO is determined based on the charges accumulated in capacitors CA and CB. Specifically, the prescribed operation described above is performed in data read circuit RDC, so that read data DO is output.

Thereafter, the write operation is performed (step S6). Specifically, the storage data is written back into the tunneling magneto-resistance element to be selected in the selected memory cell. The data read operation is thus ended (step S7).

Therefore, data reading similar to that in the first embodiment can be performed also in memory cell MC# according to the variation of the first embodiment of the present invention.

A layout of memory cell MC# according to the variation of the first embodiment of the present invention will be described with reference to FIG. 22. Here, a view from above is shown.

Figure 22:
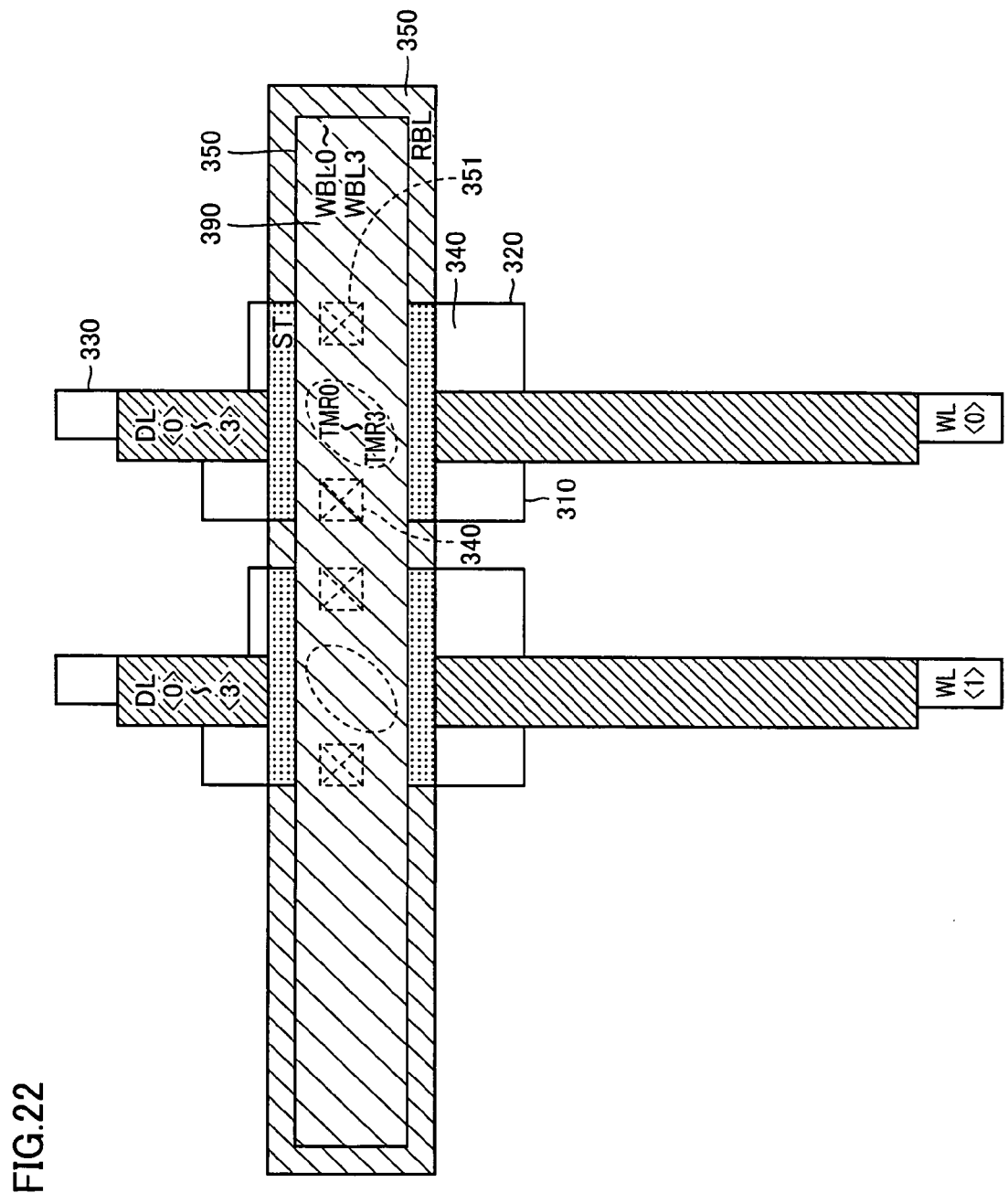
FIG. 22 illustrates a layout of the memory cell according to the variation of the first embodiment of the present invention.

Referring to FIG. 22, the structure is such that cell units CU are stacked as described above. Exemplarily explaining cell unit CU1 shown in FIG. 19, write bit line WBL1 is formed in fourth-layer metal interconnection layer 390. Tunneling magneto-resistance element TMR1 is formed between write bit line WBL1 and strap ST, below which digit line DL1 is formed by using third-layer metal interconnection layer 380. Strap ST is electrically coupled to source/drain region 310 through contact hole 340. Source/drain region 320 is electrically coupled to read bit line RBL formed in first-layer metal interconnection layer 350 through contact hole 351. Word line WL is formed in the interconnection layer where gate 330 is provided.

Therefore, as according to the configuration of the variation of the first embodiment of the present invention above, cell units CU are stacked above the access transistor, so that the number of parts can be reduced and a non-volatile memory device achieving low area penalty and higher integration can be implemented.

Second Embodiment

Figure 23:
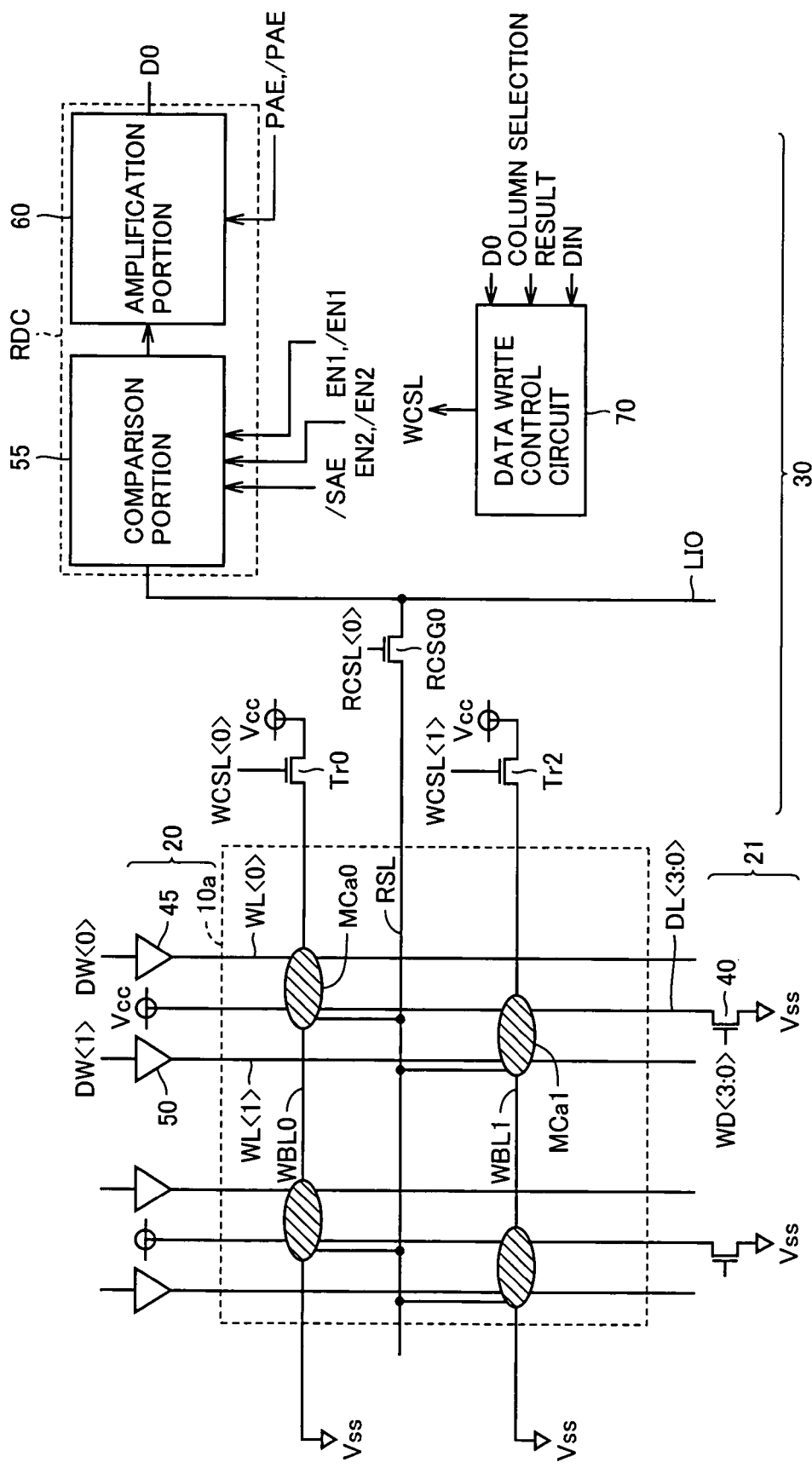
FIG. 23 is a schematic diagram showing configuration of a memory array and its peripheral circuit according to a second embodiment of the present invention.

Referring to FIG. 23, a memory array 10*a* according to a second embodiment of the present invention includes memory cells MCa arranged in matrix in an integrated manner as well as a plurality of write bit lines WBL and read source lines RSL provided corresponding to memory cell columns respectively. In addition, a plurality of word lines WL and a plurality of digit lines DL are provided corresponding to the memory cell rows respectively. In the present embodiment, write bit lines WBL0, WBL1 provided corresponding to the memory cell columns respectively and read source lines RSL and word lines WL<0>, WL<1> provided corresponding to the memory cell rows respectively are shown as representatives. In the present embodiment, a memory cell MCa0 positioned at an intersection of write bit line WBL0 and word line WL<0> and a memory cell MCa1 positioned at an intersection of write bit line WBL1 and word line WL<1> will be described as representatives. As compared with the configuration described with reference to FIG. 2, driver transistors Tr1, Tr3 are eliminated, and the other end side of write bit lines WBL0, WBL1 is pulled down to fixed voltage Vss.

In addition, read selection gate RCSG is provided corresponding to read source line RSL. In the present embodiment, read selection gate RCSG0 is provided between read source line RSL and data line LIO, and the gate thereof receives an input of read selection signal RCSL<0>.

Figure 24:
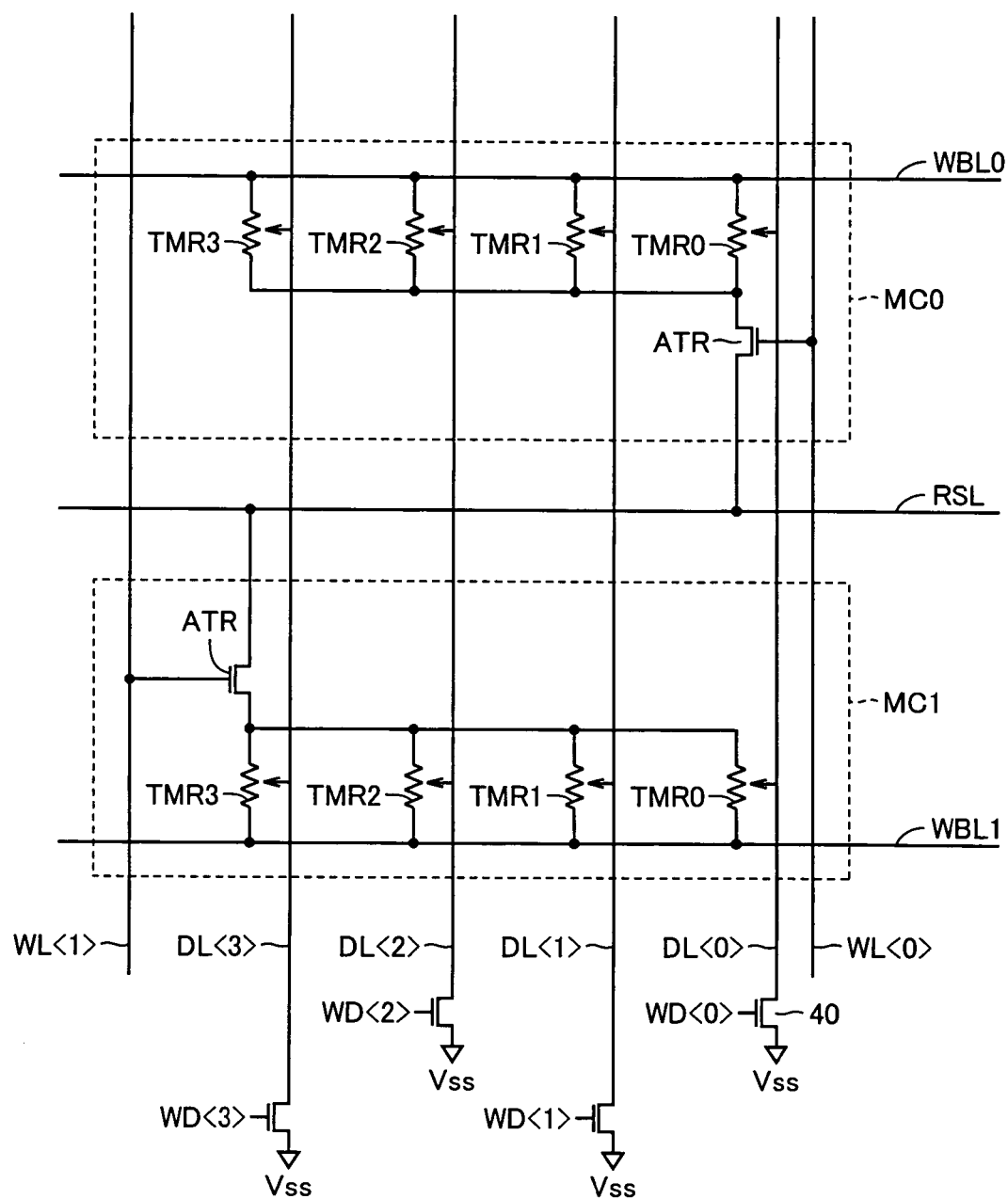
FIG. 24 is a circuit configuration diagram showing details of a memory cell according to the second embodiment of the present invention.

Referring to FIG. 24, memory cell MCa according to the second embodiment of the present invention is different from memory cell MC according to the first embodiment in the configuration of read source line RSL. Specifically, memory cell MC according to the first embodiment has been connected to source line SL provided along the memory cell row, however, in the present embodiment, the memory cell is connected to read source line RSL provided along the memory cell column.

As the configuration is otherwise the same as the configuration described with reference to FIG. 8, detailed description thereof will not be repeated.

In the configuration according to the second embodiment of the present invention, data reading is performed using read source line RSL.

Specifically, read source line RSL and data line LIO are electrically coupled to each other in response to input of read selection signal RCSL<0> ("H" level). When word line WL is activated, the current path from the side of read source line RSL to write bit line WBL electrically coupled to fixed voltage Vss through tunneling magneto-resistance element TMR is formed.

Figure 14:
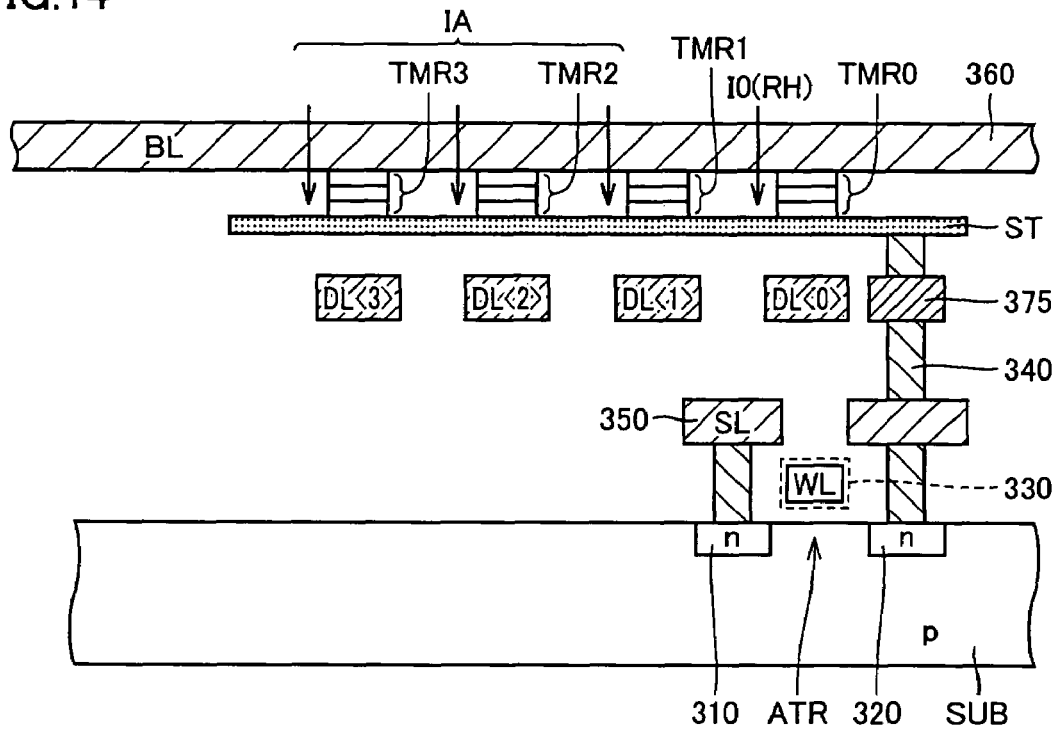
FIG. 14 illustrates data reading from a tunneling magneto-resistance element (high resistance) of the memory cell according to the first embodiment of the present invention.
Figure 15:
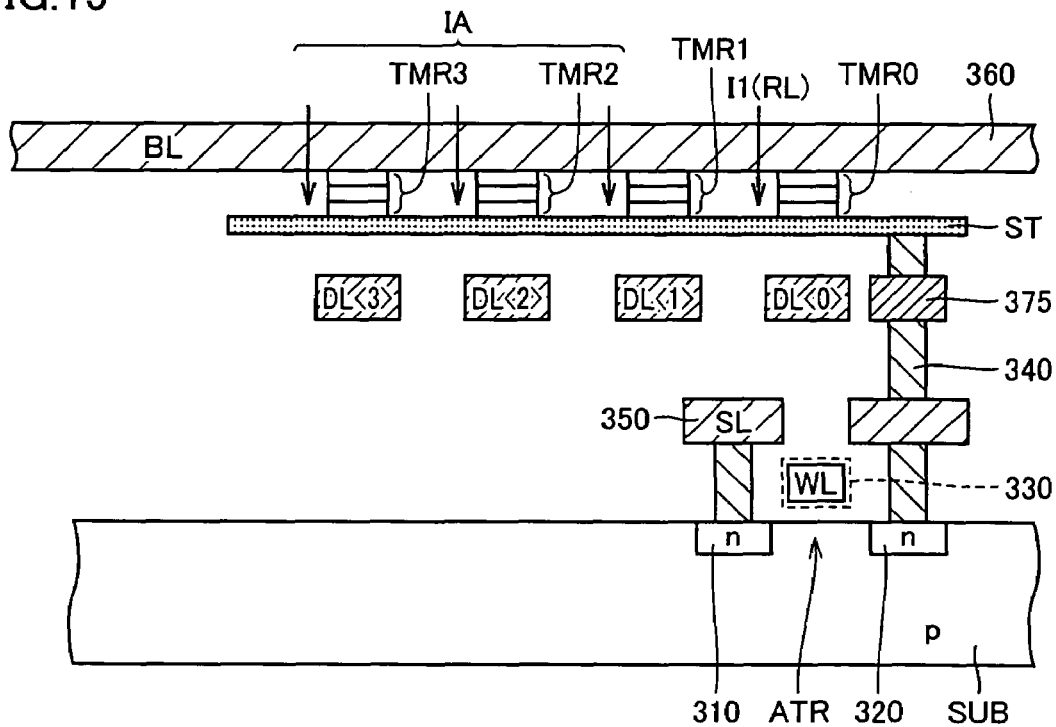
FIG. 15 illustrates data reading from a tunneling magneto-resistance element (low resistance) of the memory cell according to the first embodiment of the present invention.

Therefore, data reading similar to that described in the first embodiment can be performed, although direction of the current described with reference to FIGS. 14 and 15 is opposite.

A cross-section of memory cell MCa according to the second embodiment of the present invention will be described with reference to FIG. 25.

Figure 25:
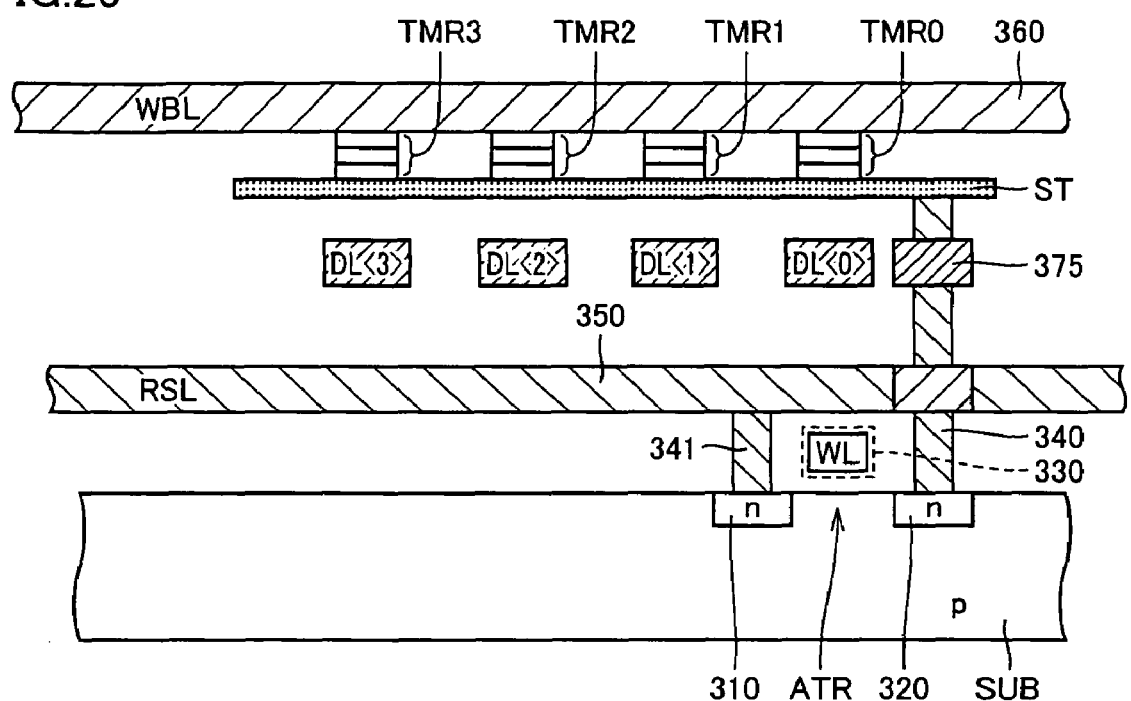
FIG. 25 illustrates a structure of the memory cell according to the second embodiment of the present invention.

Referring to FIG. 25, memory cell MCa according to the second embodiment of the present invention is different from memory cell MC described with reference to FIG. 9 in that read source line RSL is formed with the use of first-layer metal interconnection layer 350 along a direction of bit line BL. As the structure is otherwise the same as the structure of memory cell MC described with reference to FIG. 9, detailed description thereof will not be repeated.

A layout of memory cell MCa according to the second embodiment of the present invention will be described with reference to FIG. 26. Here, a view from above is shown.

Figure 26:
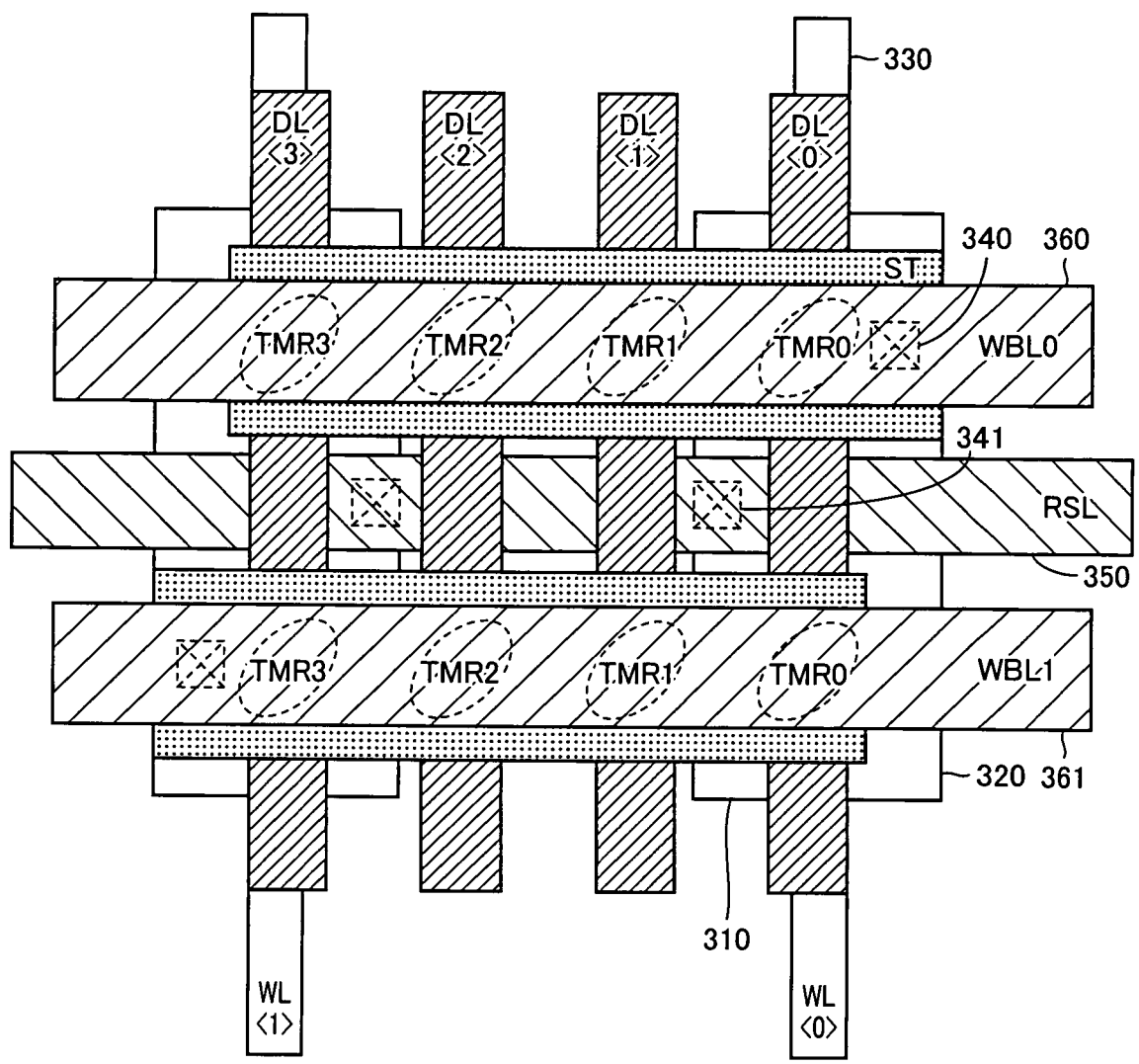
FIG. 26 illustrates a layout of the memory cell according to the second embodiment of the present invention.

Referring to FIG. 26, memory cell MCa according to the second embodiment of the present invention is different from memory cell MC described with reference to FIG. 10 in that read source line RSL is formed with the use of first-layer metal interconnection layer 350 along a direction of bit line BL as described above. As the structure of the memory cell is otherwise the same, detailed description thereof will not be repeated.

According to this configuration, it is no longer necessary to provide the driver transistor on the other end side of bit line BL as described with reference to FIG. 23. In the configuration of FIG. 2, the driver transistors should be provided on opposing sides of bit line BL, in order to share the bit line in data reading and data writing and to achieve an open state thereof in data writing. In the configuration according to the second embodiment of the present invention, however, data reading is performed using read source line RSL, and it is not necessary to achieve the open state of write bit line WBL. Therefore, the number of parts of the peripheral circuit can be reduced and an MRAM device attaining high layout efficiency can be implemented.

Data reading according to the first embodiment is performed by using bit line BL as described above. On the other hand, data reading according to the second embodiment of the present invention is performed by using read source line RSL. Considering parasitic capacitance, bit line BL is electrically coupled also to strap ST through tunneling magneto-resistance element TMR. Strap ST is formed at a location close to digit line DL. Therefore, capacitance between interconnections affecting strap ST through digit line DL in turn considerably affects bit line BL. In contrast, according to the configuration of the second embodiment of the present invention, a certain distance between read source line RSL and digit line DL is ensured, and influence on read source line RSL of the capacitance between the interconnections from the digit line DL is relatively smaller than that on bit line BL.

Therefore, load is lower in data reading using read source line RSL, and a data read operation at a speed higher than data reading using bit line BL can be achieved.

In addition, as read source line RSL is shared by two memory cells adjacent along the memory cell column, the number of interconnections can be suppressed and sufficient pitch between interconnections can be ensured.

Though the tunneling magneto-resistance element (TMR) using the thin film magnetic element has been described as an example of a magneto-resistance element in the description above, the present invention is not limited thereto. The present invention is also applicable to a giant magneto-resistance element (GMR).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device, comprising:
   a plurality of memory cells arranged in matrix of rows and columns;
   a plurality of bit lines provided corresponding to memory cell columns respectively and supplied with a first data write current in data writing, each of said memory cells including a plurality of magneto-resistance elements each performing magnetically non-volatile data storage and a switch commonly controlling electrical connection between a corresponding bit line and a fixed voltage through each said magneto-resistance element; and
   a plurality of digit lines corresponding to said plurality of magneto-resistance elements respectively and supplied with a second data write current in said data writing; wherein
   each said magneto-resistance element includes
   a fixed magnetic layer arranged along an easy axis at a prescribed angle to said corresponding bit line and a corresponding digit line, and
   a free magnetic layer having a magnetic direction reversed with respect to previous data by application of prescribed data write magnetic field, as a result of flow of said first and second data write currents having a prescribed pulse sequence in said corresponding bit line and said corresponding digit line in said data writing.

2. The non-volatile memory device according to claim 1, further comprising:
   a data line electrically coupled to a selected memory cell selected as a data read target among said plurality of memory cells and electrically coupled to said fixed voltage through said selected memory cell as a result of control by a switch included in said selected memory cell in data reading;
   a current supply circuit coupling said data line to a prescribed voltage so as to supply the selected memory cell with a through current in said data reading;
   a data write circuit for applying said prescribed data write magnetic field to said selected memory cell; and
   a data read circuit for generating read data based on storage data in said selected memory cell before and after application of said prescribed data write magnetic field performed at least once in one data read operation; wherein
   said data read circuit includes a comparison portion generating said read data based on comparison of the through current that flows as a result of data reading from said selected memory cell before and after application of said prescribed data write magnetic field.

3. The non-volatile memory device according to claim 2, wherein
   said one data read operation is performed in one data write operation, and
   said data write circuit applies said prescribed data write magnetic field to said selected memory cell based on comparison between write data and said read data generated by said comparison portion in said one data write operation.

4. The non-volatile memory device according to claim 1, further comprising a plurality of word lines provided corresponding to memory cell rows respectively, for controlling a corresponding switch in each said memory cell, wherein
   two adjacent memory cells arranged along said memory cell row have access transistors electrically connected to corresponding word lines different from each other comparable to said switch, respectively.

5. The non-volatile memory device according to claim 4, further comprising a plurality of source lines provided corresponding to said memory cell rows respectively and electrically coupled to said fixed voltage, wherein
   said access transistors in said adjacent two memory cells share a corresponding source line.

6. The non-volatile memory device according to claim 1, wherein
   said prescribed pulse sequence is set such that data write currents out of phase by 90° with respect to each other flow through said corresponding first and second write current lines.

7. A non-volatile memory device, comprising:
   a memory cell;
   a read bit line electrically coupled to said memory cell in data reading, each said memory cell including a plurality of stacked magneto-resistance elements each performing magnetically non-volatile data storage and a switch commonly controlling electrical connection between each said magneto-resistance element and said read bit line;
   a plurality of first write current lines corresponding to said plurality of stacked magneto-resistance elements respectively and supplied with a first data write current in data writing; and
   a plurality of second write current lines corresponding to said plurality of stacked magneto-resistance elements respectively and supplied with a second data write current in said data writing; wherein each said magneto-resistance element includes
a fixed magnetic layer arranged along an easy axis at an angle between said corresponding first and second write current lines, and
a free magnetic layer having a magnetic direction reversed with respect to previous data by application of prescribed data write magnetic field, as a result of flow of said first and second data write currents having a prescribed pulse sequence in said corresponding first and second write current lines in said data writing.

8. The non-volatile memory device according to claim 7, wherein
each said first write current line has one end electrically coupled to a fixed voltage and electrically coupled to a corresponding magneto-resistance element, and
said non-volatile memory device further comprises a data line electrically coupled to said read bit line in data reading; and
a data read circuit coupling said data line to a prescribed voltage in said data reading so as to generate read data based on a through current that flows in said memory cell.

9. The non-volatile memory device according to claim 7, wherein
said read bit line and each said first write current line are arranged along an identical direction.

10. The non-volatile memory device according to claim 7, wherein
said read bit line and said plurality of first write current lines are formed with a plurality of stacked metal interconnection layers, and
said read bit line is formed with the metal interconnection layer in a first layer.

11. The non-volatile memory device according to claim 7, wherein
each said first write current line has one end electrically coupled to a fixed voltage and another end electrically coupled to a power supply voltage through a driver transistor that is rendered conductive in response to a selection signal.

12. The non-volatile memory device according to claim 7, further comprising:
a data line electrically coupled to a fixed voltage through said read bit line and said memory cell in data reading;
a current supply circuit coupling said data line to a prescribed voltage so as to supply a through current to said memory cell in said data reading;
a data write circuit for applying said prescribed data write magnetic field to said memory cell; and
a data read circuit for generating read data based on storage data in said memory cell before and after application of said prescribed data write magnetic field performed at least once in one data read operation; wherein
said data read circuit includes a comparison portion generating said read data based on comparison of the through current that flows as a result of data reading from said memory cell before and after application of said prescribed data write magnetic field.

13. The non-volatile memory device according to claim 12, wherein
said one data read operation is performed in one data write operation, and
said data write circuit applies said prescribed data write magnetic field to said memory cell based on comparison between write data and said read data generated by said comparison portion in said one data write operation.

* * * * *